United States Patent [19]
Link

[11] Patent Number: 6,162,661
[45] Date of Patent: Dec. 19, 2000

[54] SPACER PLATE SOLDER BALL PLACEMENT FIXTURE AND METHODS THEREFOR

[75] Inventor: Joseph Link, Pleasanton, Calif.

[73] Assignee: Tessera, Inc., San Jose, Calif.

[21] Appl. No.: 09/086,808

[22] Filed: May 29, 1998

Related U.S. Application Data

[60] Provisional application No. 60/048,178, May 30, 1997.

[51] Int. Cl.⁷ .......................... H01L 21/44; H01L 21/48; H01L 21/50
[52] U.S. Cl. .......................... 438/108; 438/613; 438/616
[58] Field of Search ..................................... 438/108, 613, 438/616; 257/738, 778; 427/96, 259, 282, 310; 361/767, 772, 758; 29/879

[56] References Cited

U.S. PATENT DOCUMENTS

| | | |
|---|---|---|
| 3,303,393 | 2/1967 | Hymes et al. . |
| 4,914,814 | 4/1990 | Behun et al. . |
| 5,011,066 | 4/1991 | Thompson . |
| 5,203,075 | 4/1993 | Angulas et al. . |
| 5,233,504 | 8/1993 | Melton et al. . |
| 5,255,839 | 10/1993 | daCosta Alves et al. . |
| 5,261,593 | 11/1993 | Casson et al. . |
| 5,349,495 | 9/1994 | Visel et al. . |
| 5,431,332 | 7/1995 | Kirby et al. . |
| 5,439,162 | 8/1995 | George et al. . |
| 5,447,886 | 9/1995 | Rai .......................................... 257/738 |
| 5,468,681 | 11/1995 | Pasch ...................................... 257/698 |
| 5,477,086 | 12/1995 | Rostoker et al. . |
| 5,477,419 | 12/1995 | Goodman et al. . |
| 5,482,736 | 1/1996 | Glenn et al. . |
| 5,492,266 | 2/1996 | Hoebener et al. ....................... 427/282 |
| 5,547,530 | 8/1996 | Nakamura et al. ........................ 427/96 |
| 5,637,832 | 6/1997 | Danner ..................................... 361/767 |
| 5,782,399 | 7/1998 | Lapastora ................................... 29/879 |
| 5,796,590 | 8/1998 | Klein ........................................ 361/774 |
| 5,879,761 | 3/1999 | Kulesza et al. ............................. 427/96 |

*Primary Examiner*—David E. Graybill
*Attorney, Agent, or Firm*—Lerner, David, Littenberg, Krumholz & Mentlik, LLP

[57] ABSTRACT

A method placing conductive elements, such as solder balls, over terminals on a microelectronic assembly includes providing a microelectronic element having a first surface and one or more terminals accessible at the first surface, and securing a spacer plate having a top surface, a bottom surface and at least one opening extending therethrough over the first surface of the microelectronic element so that the at least one opening is in substantial alignment with the terminals. After the spacer plate has been secured over the first surface of the microelectronic element, a stencil for placing conductive elements is then secured over the spacer plate. The stencil has a top surface and a bottom surface and a plurality of openings extending therethrough. When the stencil is secured over the spacer plate, the plurality of openings in the stencil are in substantial alignment with the terminals. As a result, the spacer plate maintains the stencil remote from the terminals. The conductive elements, such as solder balls, are then deposited through the plurality of openings in the stencil so that each deposited conductive element is affixed atop one of the terminals of the microelectronic assembly.

32 Claims, 19 Drawing Sheets

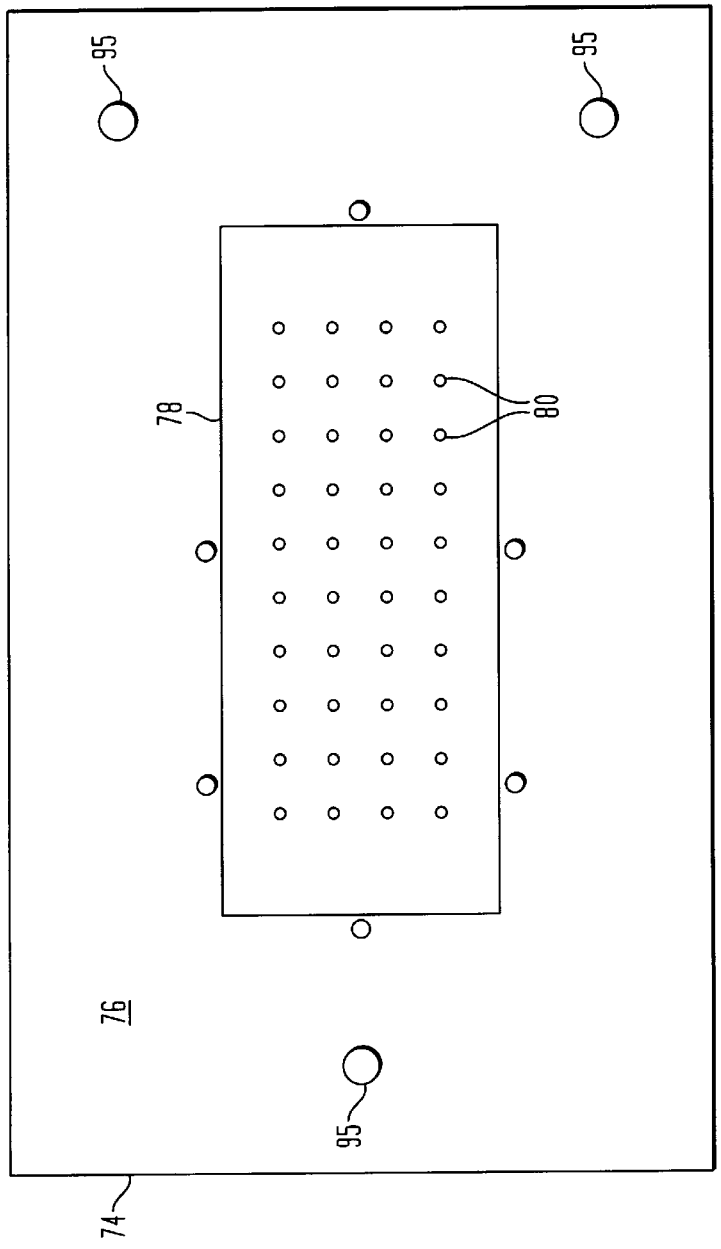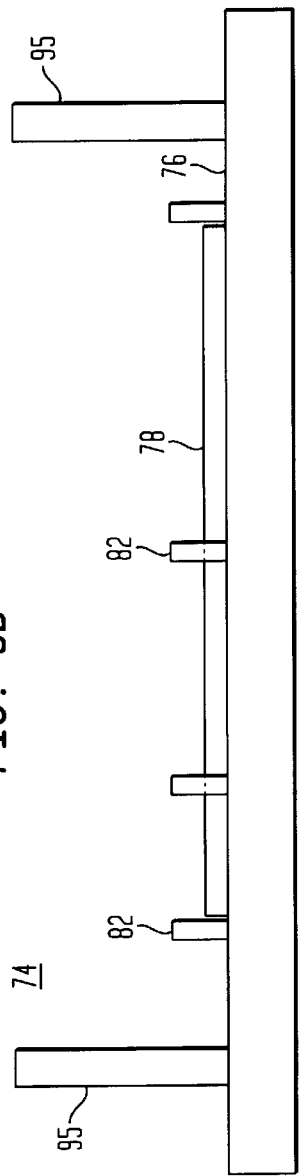

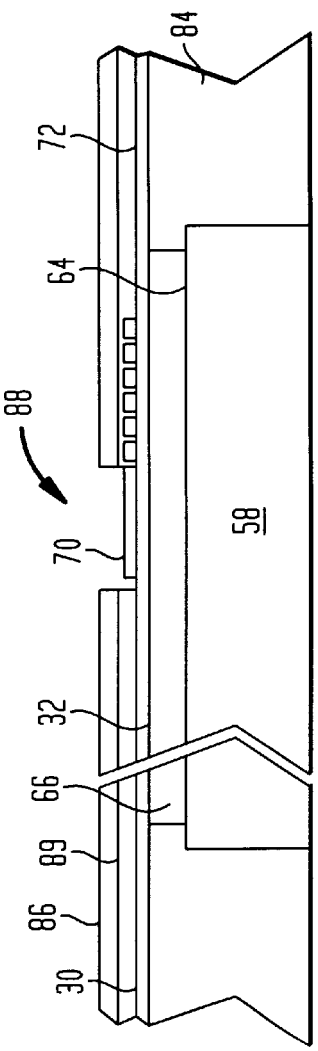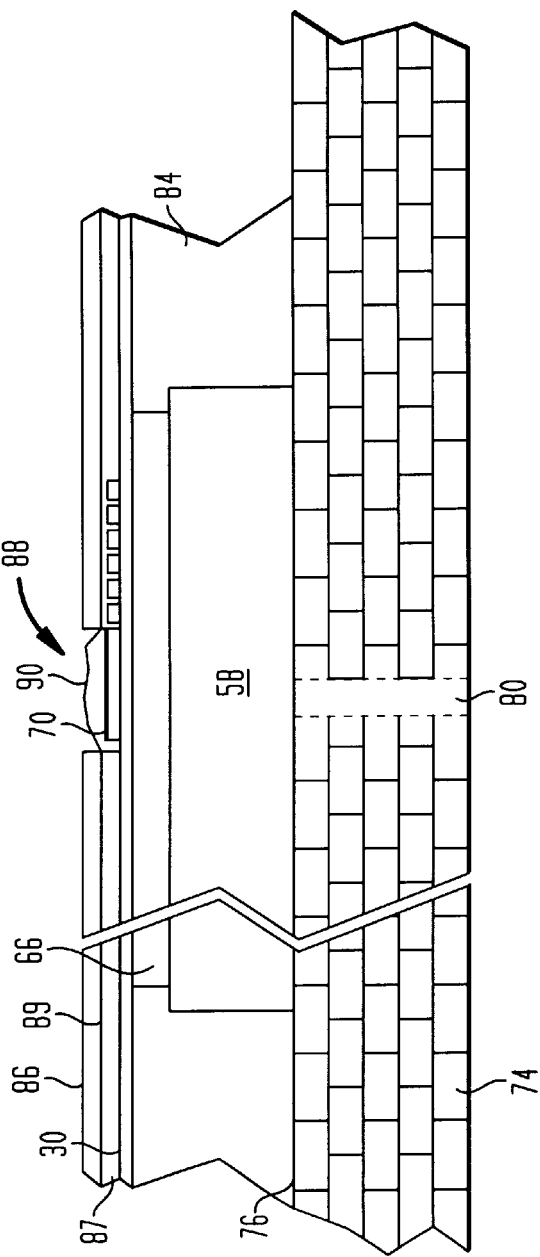

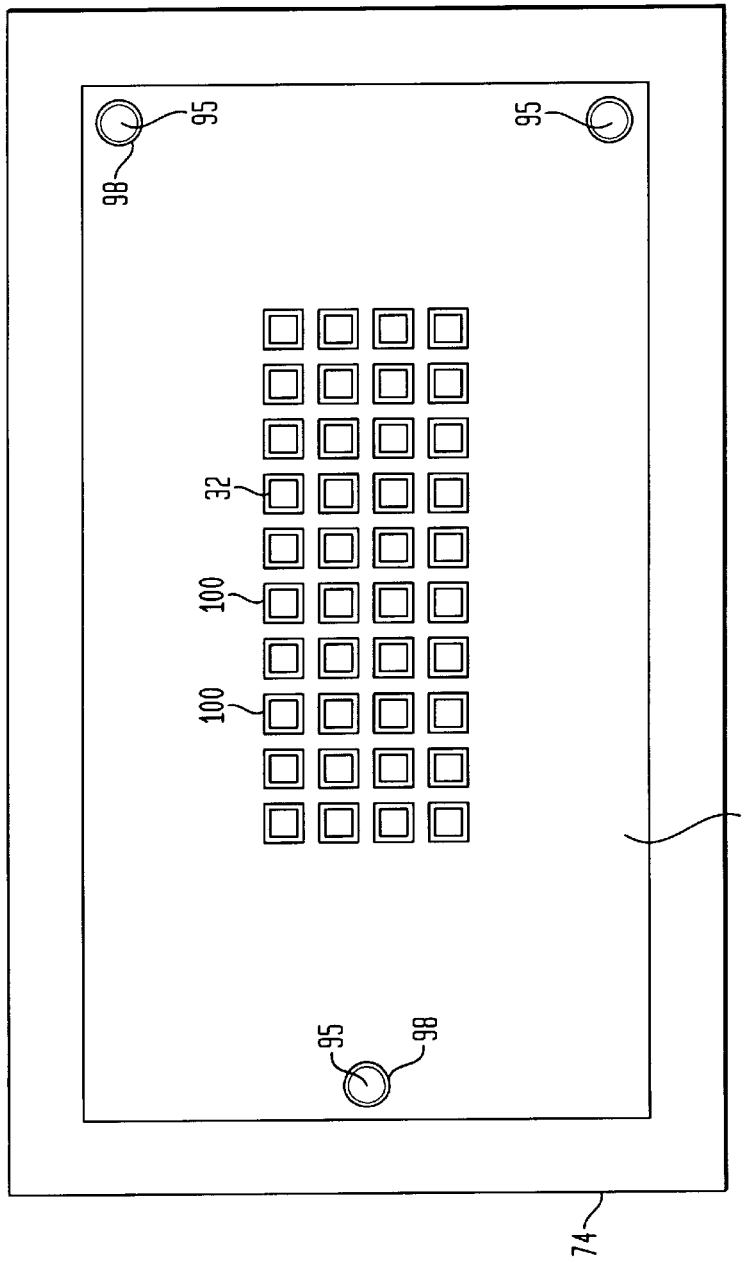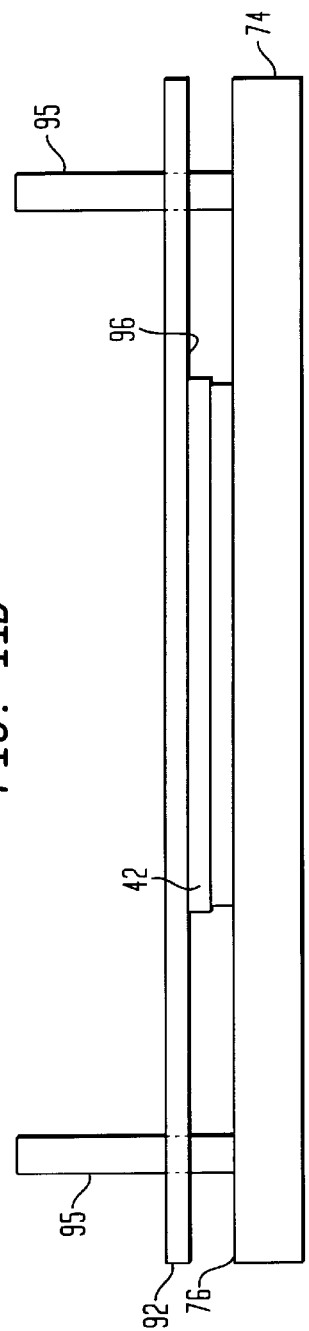

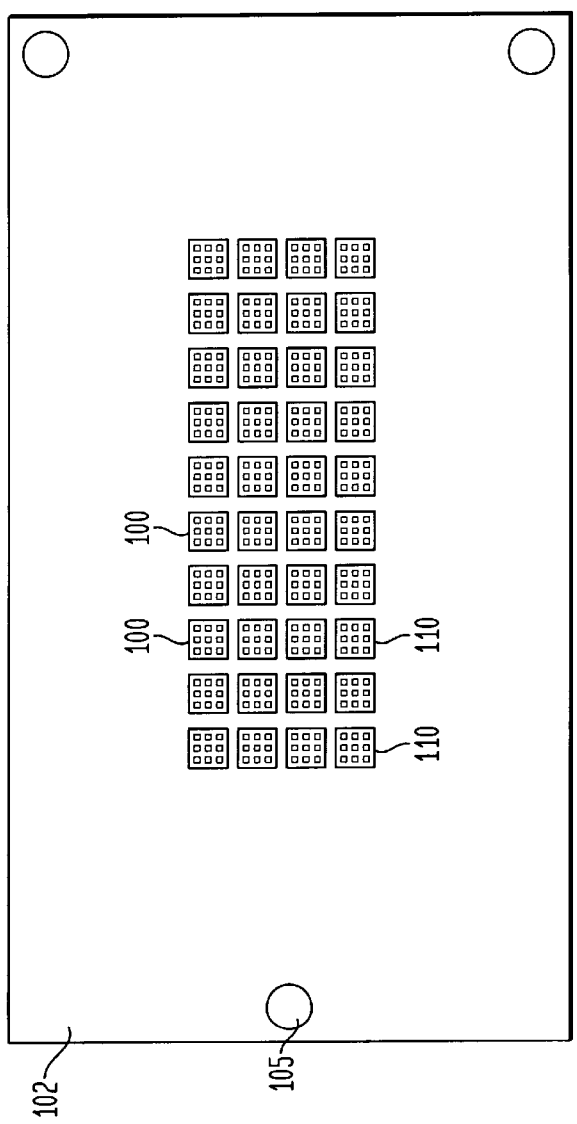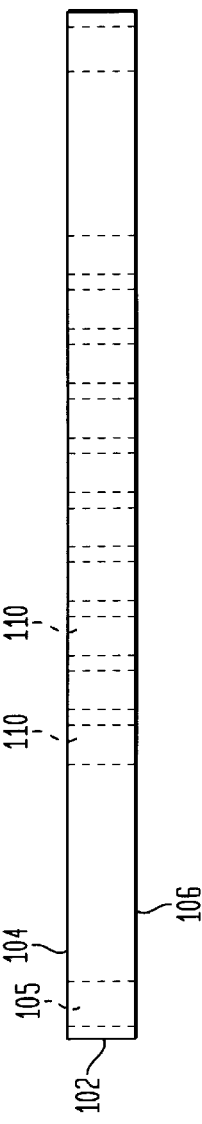

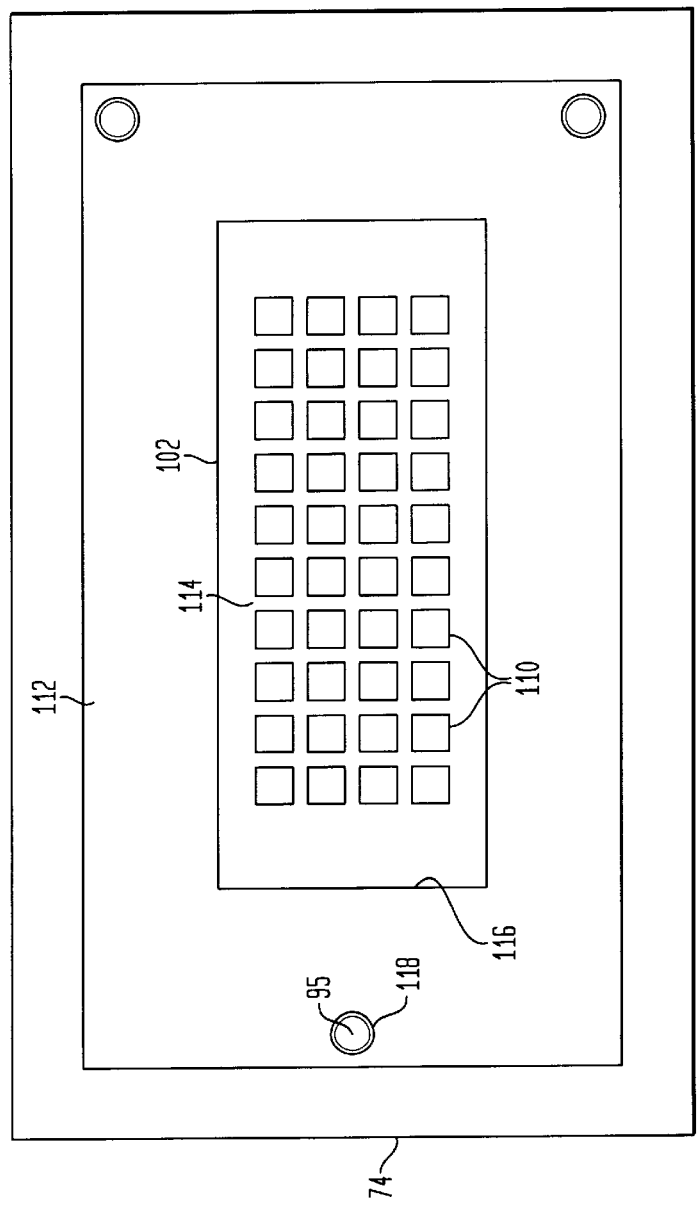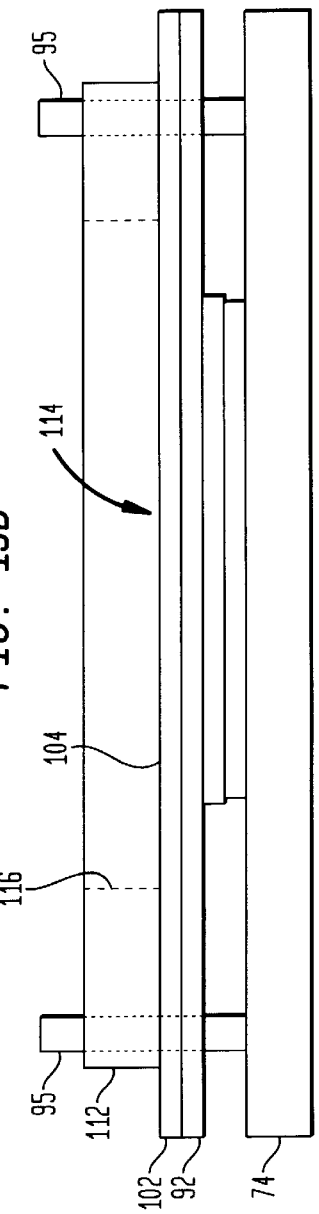

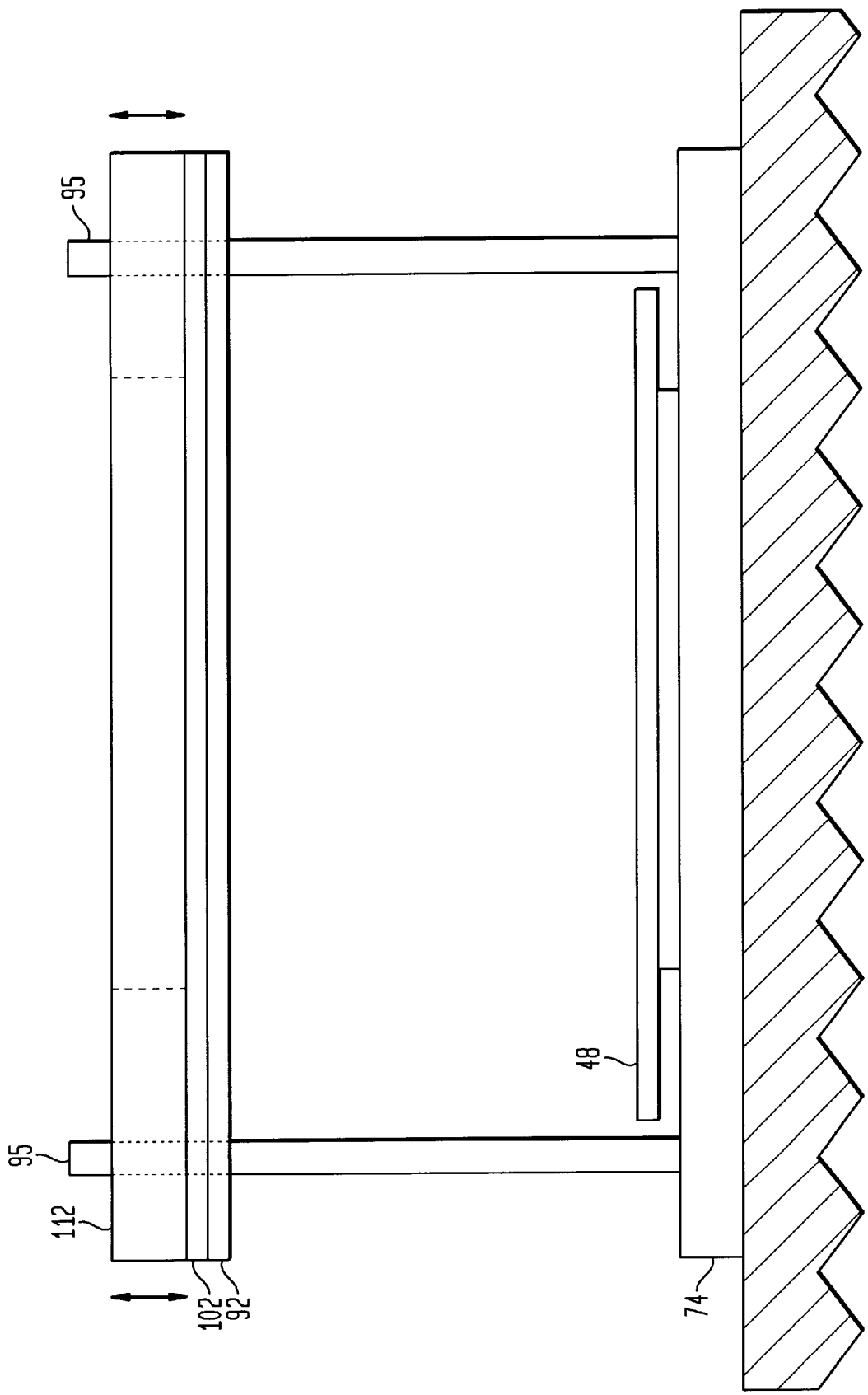

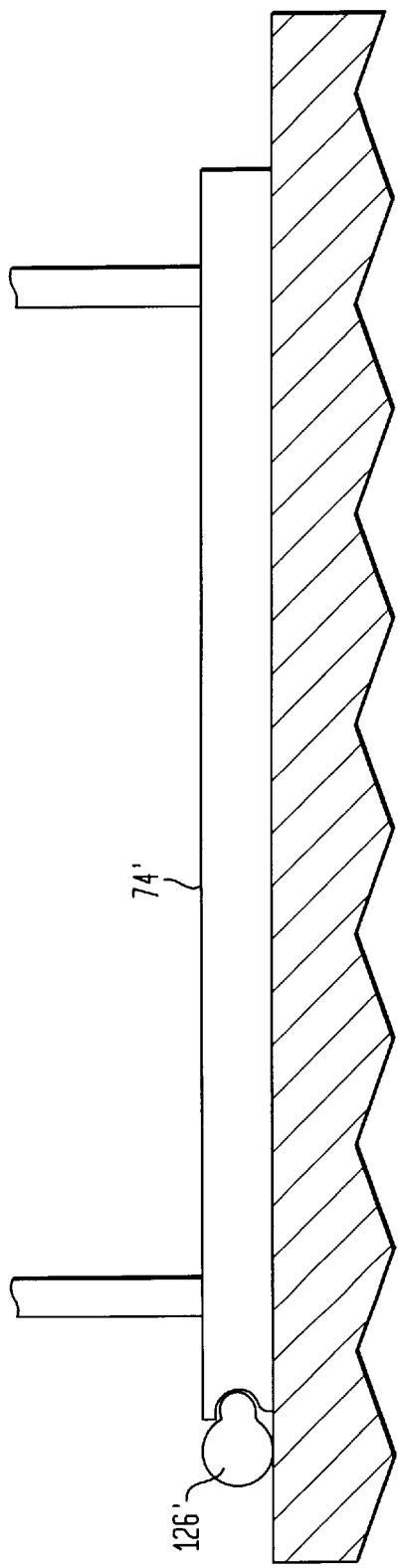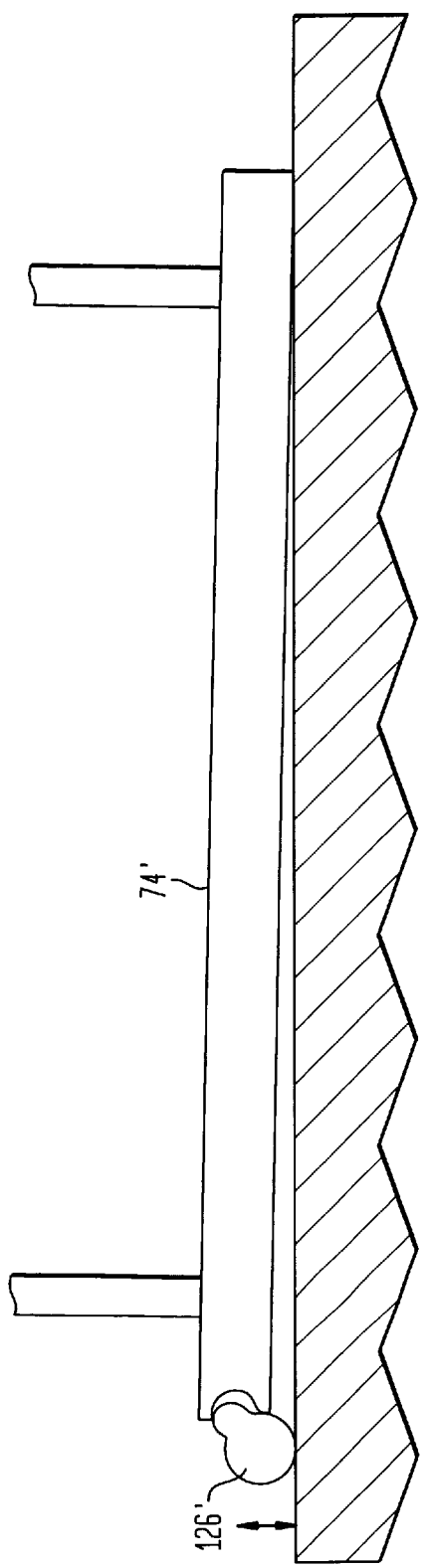

6,162,661

SPACER PLATE SOLDER BALL PLACEMENT FIXTURE AND METHODS THEREFOR

CROSS REFERENCE TO RELATED APPLICATIONS

This application claims benefit of United States Provisional Application Serial No. 60/048,178, filed May 30, 1997, the disclosure of which is hereby incorporated by reference herein.

FIELD OF THE INVENTION

The present invention generally relates to methods of making microelectronic assemblies, and more particularly relates to methods of affixing conductive elements, such as solder balls, on terminals accessible at one or more surfaces of a microelectronic assembly.

BACKGROUND OF THE INVENTION

A microelectronic element, such as a semiconductor chip, is typically connected to an external circuit element through contacts accessible at a surface of the microelectronic element. For example, in the tape automated bonding process (hereinafter referred to as the "TAB" process), a flexible dielectric sheet, such as a thin foil of polyimide, includes conductive terminals accessible at a surface thereof and flexible metallic leads connected to the terminals. The flexible dielectric sheet also preferably includes one or more bond windows extending therethrough. Each flexible lead preferably has a first end integrally connected to one of the conductive terminal and a second end remote therefrom which projects beyond one of the bond windows. The flexible dielectric sheet is typically juxtaposed with a semiconductor chip so that the bond windows are aligned with contacts on a front end face of the chip and so that the second ends of the leads overlie the contacts. The flexible leads may then be bonded to the chip contacts using bonding techniques, such as ultrasonic or thermocompression bonding. After the bonding step, the chip package may be electrically interconnected with an external circuit element, such as a printed circuit board, by connecting the conductive terminals with contact pads on the external circuit element.

The electrical interconnections between the conductive terminals of the chip package and the external circuit element are typically made by using fusible conductive elements, such as solder balls. The solder balls are positioned between the conductive terminals on the chip package and the contact pads on the external circuit element and then reflowed by raising the temperature of the solder balls above a predetermined temperature, generally referred to as the melting point of the solder balls. The melting point is defined as the temperature at which the solder balls transform from a first solid or frozen condition to a second molten or at least partially liquid condition. Once the solder balls have transformed to the second at least partially liquid condition, the solder balls remain in that condition as long as the temperature is maintained at or above the melting point. After the conductive terminals of the chip package and the contact pads of the external circuit element have been electrically interconnected by the reflowed solder balls, the temperature of the solder balls may be reduced to a level below the melting point, whereupon the solder balls transform from the second at least partially liquid condition to the first solid condition. The refrozen solder balls both mechanically and electrically interconnect the chip contacts with the contact pads on the external circuit element.

Existing methods for placing solder balls on conductive terminals have encountered a number of problems. First, production rates have remained low because placing solder balls on microelectronic assemblies is a slow and time consuming process. In addition, a material known as flux often is used to facilitate the solder bonding process. The flux aids in removal of metal oxides and helps the molten solder to wet to the terminals. The flux typically has a pasty consistency and helps to hold solder balls on the terminals. The flux often comes in contact with a stencil used to align and place the solder balls atop the terminals. This may result in the flux becoming clogged in the stencil openings. Because the flux has adhesive-like properties this may result in some of the solder balls sticking to the stencil or the openings in the stencil, rather than passing completely through the stencil openings.

Another problem occurs when the solder balls placed in the stencil openings and resting on the terminals and flux protrude from the top surface of the stencil at the openings therein. The existence of high profile solder balls protruding at the top surface of the stencil may prevent other solder balls from moving freely across the top of the stencil in order to fill other openings therein. Moreover, solder balls which have been previously deposited in one of the stencil openings may become dislodged from the opening by other solder balls moving across the top of the stencil. The occurrence of any of these problems may result in the production of defective microelectronic packages, i.e. packages having one or more solder balls which are not properly secured over each conductive terminal.

Thus, there is a need for improved methods for placing conductive elements efficiently and reliably atop conductive terminals. There is also a need for an improved placement fixture for placing conductive elements atop conductive terminals so as to create durable and reliable electrical interconnections between microelectronic elements.

SUMMARY OF THE INVENTION

In accordance with one preferred embodiment of the present invention, a method of placing conductive elements, such as solder balls, over conductive terminals on a microelectronic assembly includes providing a microelectronic element having a first surface and one or more terminals accessible at the first surface of the microelectronic element. The microelectronic element may include any component having contact pads or conductive terminals accessible at one or more surfaces thereof. In preferred embodiments the microelectronic element may include a semiconductor chip, a printed circuit board, a flexible dielectric sheet or any other microelectronic element or electronic component having conductive terminals accessible at one or more surfaces thereof. Next, masses of flux material are selectively deposited atop the terminals. The masses of flux material may be applied by using a wide array of techniques including a pin transfer of flux, a syringe deposit of flux, roll-type printing, screen printing or stencil printing. A stencil having a top surface and a bottom surface and a plurality of openings extending between the top and bottom surfaces is then sectired over the first surface of the microelectronic element so that the openings in the stencil are in substantial alignment with the masses of flux material provided over the conductive terminals. The stencil is then maintained remote from the masses of flux immaterial and a conductive element is deposited through each of the openings in the stencil so that a conductive element is affixed atop each flux mass.

In one preferred embodiment, the step of selectively depositing a mass of flux material may include providing a flux stencil having a top surface and a bottom surface and a plurality of openings extending between the top and bottom surfaces and abutting the bottom surface of the flux stencil against the first surface of the microelectronic element so that the flux stencil openings are in substantial alignment with the conductive terminals. A bead of flux material may then be provided over the top surface of the flux stencil and the flux material screened across the top surface of the flux stencil, thereby forcing the flux material into the openings in the flux stencil to form a mass of flux material over each of the terminals. In preferred embodiments the flux stencil has a thickness of approximately 20–25 microns so that after the flux material has been screened across the top surface of the flux stencil, each flux pad has a thickness of approximately 20–50 microns.

In one preferred embodiment, the stencil for depositing the conductive elements includes a main body portion having a top surface and a bottom surface and a plurality of openings extending between the top and bottom surfaces. The main body portion preferably includes a substantially flat plate having a thickness of approximately 160–200 microns. The stencil also includes a spacer element under the bottom surface of the main body for holding the bottom surface of the main body remote from the masses of flux material. In preferred embodiments, when the stencil is juxtaposed with the first surface of the microelectronic element, the spacer element is between the bottom surface of the main body and the first surface of the microelectronic element. In one particular embodiment the spacer element includes a substantially flat plate provided between the first surface of the microelectronic element and the bottom surface of the main body and includes one or more openings extending therethrough for allowing the conductive elements to pass through the spacer element. In other preferred embodiments the spacer element includes one or more support ribs extending under the bottom surface of the main body. The support ribs may be attached to the bottom surface of the main body or may be integrally connected to and project from the bottom surface of the main body portion.

The step of depositing a conductive element in each of the openings may include a plurality of conductive elements over a top surface of a conductive element stencil and then moving the conductive elements over the top surface of the stencil so that one conductive element is deposited in each opening. The conductive elements may be moved over the top of the conductive element stencil by using a brush or other moving means. In certain embodiments, before the plurality of conductive elements are provided over the top surface of the stencil, a reservoir is placed over the top of the stencil to retain the conductive elements within a designated area. In other words, the reservoir prevents excess conductive elements (i.e. those which have not been placed in an opening) from moving over the edge of the stencil. The reservoir preferably includes a central aperture extending from a top surface to a bottom surface thereof, the central aperture defining internal side walls having sufficient height to retain all of the conductive elements over the top surface of the stencil. The reservoir is preferably secured over the top of the stencil before the conductive elements are introduced. The reservoir may also include a pocket or depression in one of the internal side walls for capturing any excess solder balls remaining over the top surface of the stencil after the depositing step.

The conductive elements preferably include a mass of a fusible material, such as solder balls having spherical shapes. In more preferred embodiments the conductive elements include solder balls comprising tin and lead, such as solder balls comprising approximately 60–65% tin and 35–40% lead. The solder balls preferably have melting points at which the solder balls transform from a first solid condition to a second molten or at least partially liquid condition. In further preferred embodiments, the conductive elements include composite conductive elements having a core which includes a conductive material (e.g. metal) or a dielectric material (e.g. elastomer), as disclosed in commonly assigned U.S. Provisional Application Serial No. 60/073,520, filed Feb. 3, 1998, the disclosure of which is hereby incorporated by reference herein. The core may be spherical in shape and may be entirely solid or hollow. In addition, the core may be substantially rigid or compliant. Each composite conductive element preferably includes a layer of a conductive material which surrounds the core. The layer of conductive material is preferably about 25–50 microns or less. The layer of conductive material typically conducts electricity, however, in other embodiments the conductive material may conduct both electricity and heat.

After the conductive elements have been deposited on the masses of flux material, the microelectronic assemblies may be heated so as to transform the conductive elements from the first solid condition to the second at least partially liquid condition. Heating may occur by placing the microelectronic assemblies in a furnace, such as an IR furnace, a hot-plate furnace or a convection furnace. In certain preferred embodiments, the furnace is a forced-air convection oven. During the heating step, the conductive elements are elevated to a temperature above their melting point and are preferably maintained at or above the melting point temperature for a predetermined period of time. When the conductive elements are in the second at least partially liquid condition, surface tension will cause the liquefied conductive elements to assume a substantially spherical shape atop the conductive terminals. After reflow, the conductive elements are cooled to a temperature below their melting point, whereupon the conductive elements transform from the second at least partially liquid condition to the first solid condition.

After the conductive elements have been re-solidified, the microelectronic assemblies may be further treated to remove any excess flux remaining on the assembly in the vicinity of the conductive terminals. The process of removing the excess flux comprises immersing the microelectronic assemblies in a flux softening solution, such as a solution including alcohol, and then scrubbing the conductive terminals and conductive elements to remove the excess flux therefrom. In one particular preferred embodiment, the excess flux is removed by placing the microelectronic assemblies in a magazine and then immersing the magazine in a container holding a solution including alcohol. The magazine is then removed from the container and allowed to drip-dry so that any excess solution falls back into the container. Individual microelectronic assemblies may then be removed from the magazine and placed in a mechanical treatment container holding a second flux softening solution, such as a solution including alcohol. While the microelectronic assemblies are held under the second solution, a brush may be utilized to scrub around the conductive terminals so as to remove excess flux.

A vacuum force may also be used to secure the assemblies in place during certain stages of the assembly process. Specifically, a work holder having a top surface and an array of vacuum holes provided in a central region thereof may be provided. During certain processing steps, one or more microelectronic assemblies may be placed over the vacuum holes in the work holder and a vacuum applied to retain the assemblies in place over the work holder while the flux pads and conductive elements are placed over the terminals. The work holder preferably includes one or more sets of alignment posts projecting from the top surface thereof so that the flux stencil, the solder ball stencil and the reservoir may be properly aligned over the work holder. Proper alignment of the solder ball stencil in the X, Y and Z directions is critical for correct placement of the solder balls.

The methods described above may be used on a wafer-level scale to simultaneously form a plurality of masses of flux material over a plurality of contacts on a semiconductor wafer whereby each contact on the wafer has a flux pad formed thereon. The methods may also be used simultaneously on a plurality of semiconductor chips which are provided side-by-side in an array.

In another preferred embodiment of the present invention, a stencil for placing conductive elements over pads accessible at a first surface of a microelectronic element includes a main body having a top surface and a bottom surface and a plurality of openings extending between the top and bottom surfaces. The main body is preferably adapted for overlying the first surface of the microelectronic element so that the openings in the main body are in substantial alignment with the pads accessible at the first surface of the microelectronic element. The stencil also includes a spacer element under the bottom surface of the main body which is adapted for maintaining the main body above the first surface of the microelectronic element and remote from the pads. The pads may include conductive terminals or may include masses of flux material overlying conductive terminals. In one particular embodiment, the spacer element includes a substantially flat plate which is adapted for lying between the bottom surface of the main body and the first surface of the microelectronic element for holding the main body remote from the pads. The substantially flat plate includes one or more openings extending therethrough so that conductive elements may freely pass through the openings. In other embodiments the spacer element is attached to the bottom surface of the main body. The spacer element may also include one or more ribs extending along the bottom surface of the main body. In further embodiments the ribs may be integrally connected to and project from the bottom surface of the main body.

BRIEF DESCRIPTION OF THE DRAWINGS

FIG. 6A shows a top view of a work holder in accordance with one preferred embodiment of the present invention, FIG. 6B shows a side view of FIG. 6A.

FIG. 8 shows one stage of a method for placing masses of flux material atop conductive terminals in accordance with one preferred embodiment of the present invention.

FIG. 9 shows a further stage of the method shown in FIG. 8.

FIG. 11A shows a top view of the spacer element of FIG. 10A after the spacer element has been positioned atop the work holder.

FIG. 11B shows a side view of FIG. 11A.

FIG. 12A shows a top view of a solder ball spacer stencil used for placing solder balls atop conductive terminals in accordance with one preferred embodiment of the present invention.

FIG. 12B shows a side view of FIG. 12A.

FIG. 15A shows a top view of a reservoir positioned over the work holder in accordance with one preferred embodiment of the invention.

FIG. 15B shows a side view of FIG. 15A.

FIGS. 16–21 show various stages of one preferred method of placing solder balls on conductive terminals.

FIGS. 24A and 24B show side views of a work holder in accordance with further preferred embodiments of the present invention.

DETAILED DESCRIPTION OF PREFERRED EMBODIMENTS

Semiconductor chip packages may be assembled using mass-productive techniques, such as by using certain methods disclosed in commonly assigned U.S. patent application Ser. No. 09/012,590, filed Jan. 23, 1998, the disclosure of which is hereby incorporated by reference herein. After the semiconductor chip packages have been assembled in accordance with the methods disclosed in the '590 application and before the individual chip packages are electrically interconnected with other electronic elements, conductive elements, such as solder balls, are typically affixed to conductive terminals on the respective packages.

Figure 1:
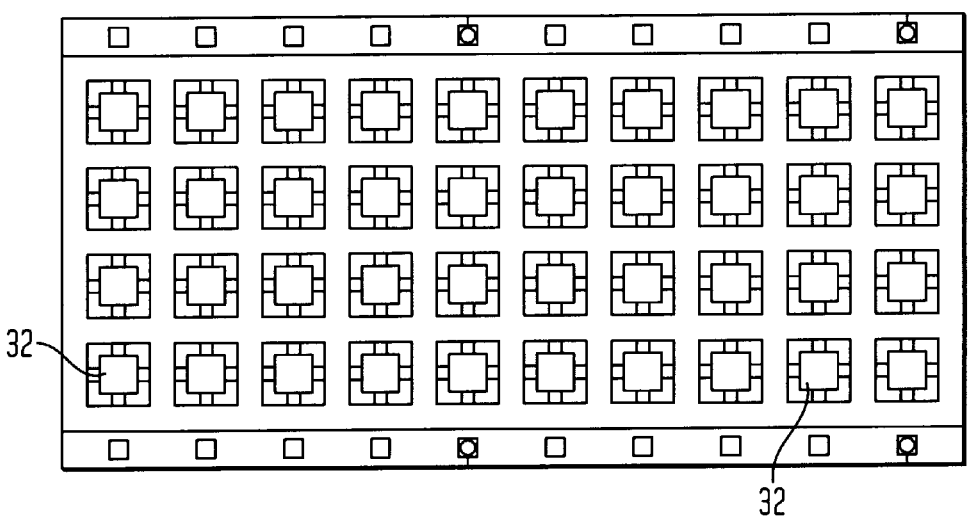
FIG. 1 shows a top view of a flexible dielectric sheet including a plurality of connection components according to one embodiment of the present invention.
Figure 2:
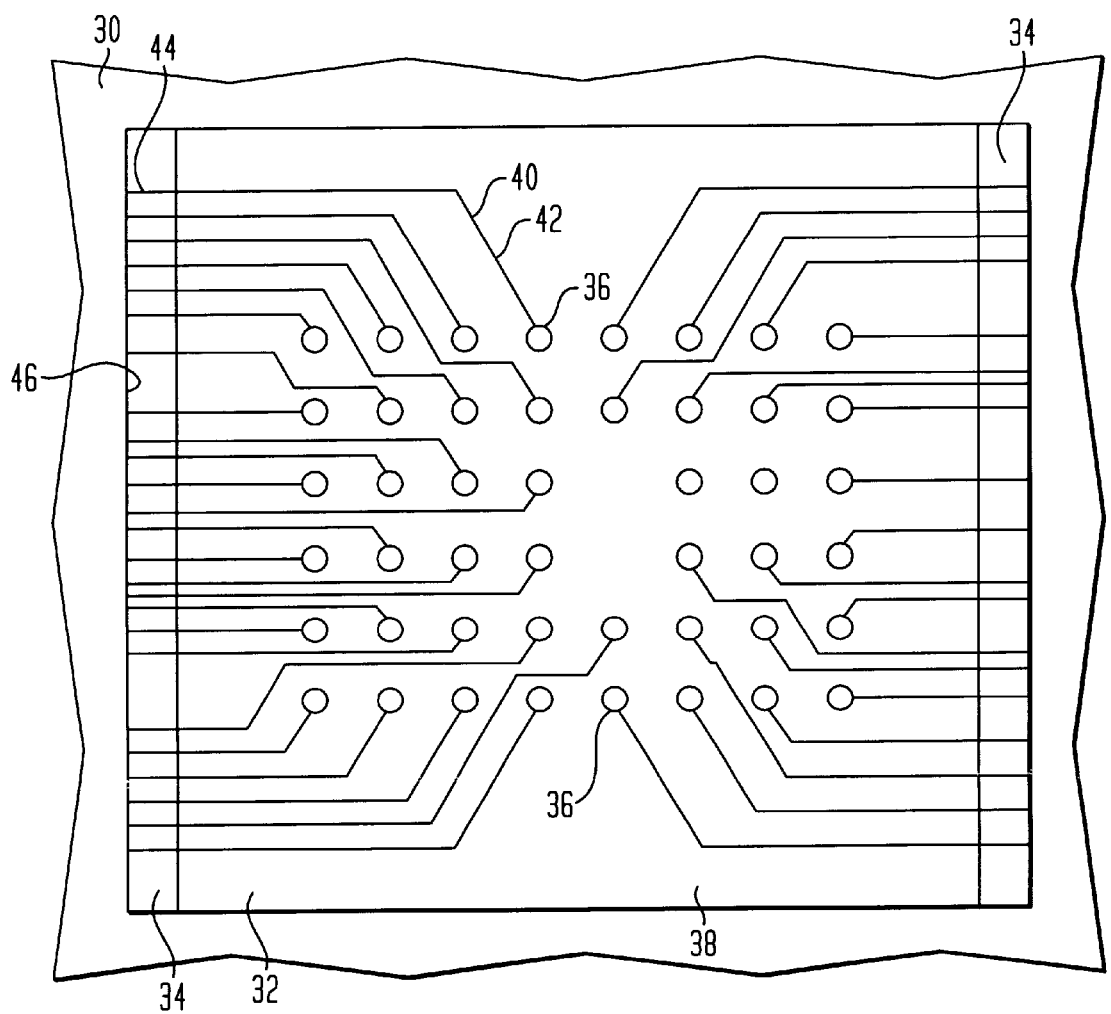
FIG. 2 shows a close up view of one of the connection components shown in FIG. 1.

In one preferred method of the '590 application, a flexible dielectric sheet includes an array of connection components and a semiconductor chip assembled with each connection component. Referring to FIG. 1, the flexible dielectric sheet 30 preferably has a thickness of approximately 25–75 microns and may include a polymeric material, such as KAPTON (E), sold by DuPont Chemical Corporation. The flexible dielectric sheet 30 has a plurality of the connection components 32, such as the 3×10 array of the connection components 32 shown in FIG. 1. FIG. 2 shows a close-up view of one of the connection components 32 shown in FIG. 1. Each connection component 32 preferably includes an attachment region (not shown) at a first surface of the flexible dielectric sheet 30 and one or more bond windows 34 surrounding the attachment region. Each connection component 32 also includes conductive terminals 36 accessible at the second surface 38 of the dielectric sheet 30 and flexible leads 40 integrally connected to the conductive terminals 36. Each flexible lead 40 typically has a first end 42 integrally connected to one of the conductive terminals 36 and a second end 44, remote therefrom, which at least partially overlies one of the bond windows 34. After a semiconductor chip has been assembled with the attachment region of the connection component 32, the bond windows 34 provide access to contacts on a front face of the semiconductor chip so that the second ends 44 of the flexible leads 40 may be readily bonded to the chip contacts. As disclosed in the '590 application, the second ends 44 of the flexible leads 40 may be broken away from outer edges 46 of the bond window 34 and pushed downwardly toward the contacts for bonding the second ends 44 of the flexible leads 40 with the chip contacts. The connection component 32 generally provides a compliant interface for the semiconductor chip so that each chip package may withstand the stresses and strains of thermal cycling.

Figure 3:
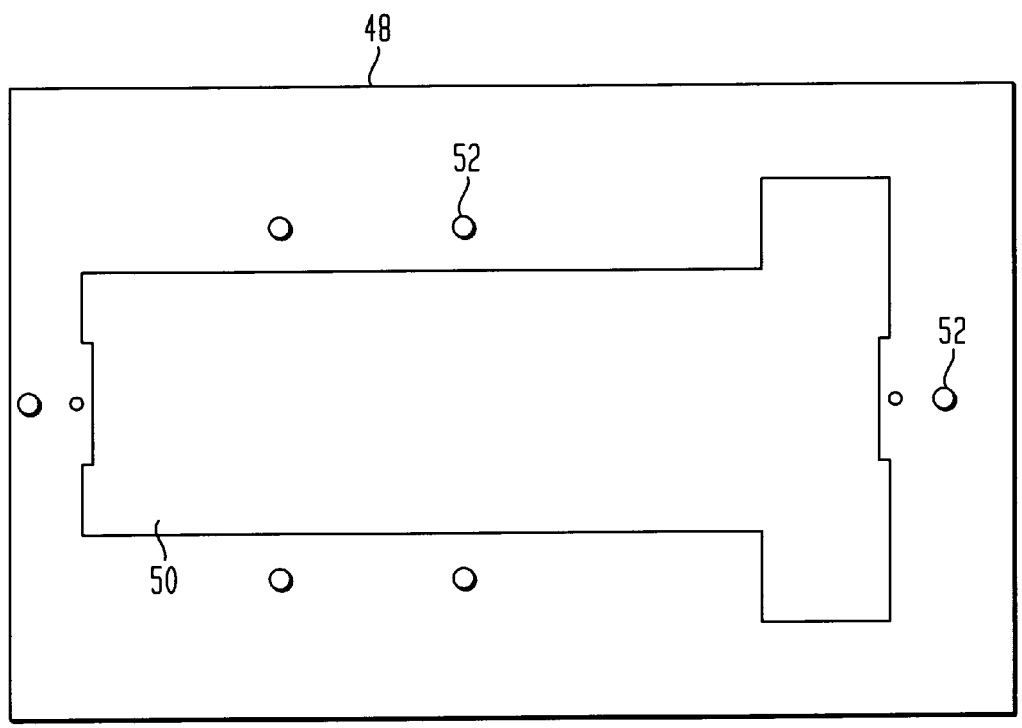
FIG. 3 shows a top view of a carrier frame used for supporting the flexible dielectric sheet of FIG. 1 in accordance with one preferred embodiment of the present invention.
Figure 4:
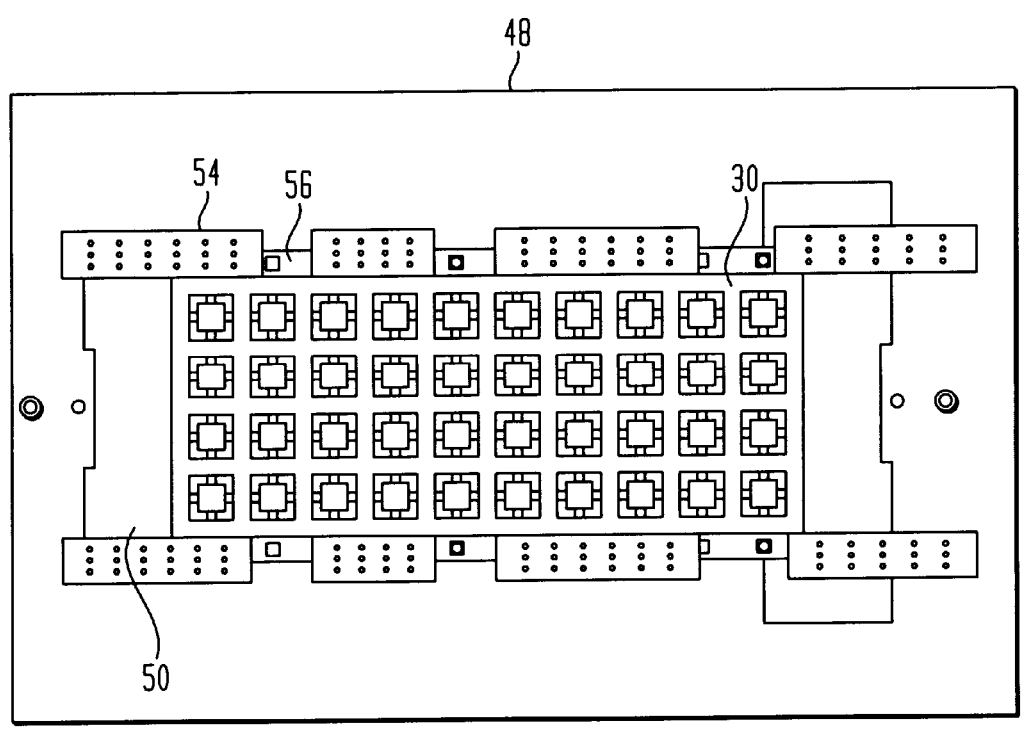
FIG. 4 shows the carrier frame of FIG. 3 with the flexible dielectric sheet of FIG. 1 secured thereto.

FIG. 3 shows a carrier frame 40 which may be used for handling the dielectric sheet 30 of FIG. 1 during certain stages of the assembly process. The carrier frame 48 includes an elongated slot 50 formed in the center thereof and has carrier frame alignment apertures 52. During certain stages of the assembly process, the flexible dielectric sheet 30 is secured to the carrier frame 48 using adhesive strips 54, with the side edges 56 of the dielectric sheet 30 overlying the sides of the elongated slot 50, as shown ii FIG. 4. Other embodiments of the carrier frame 48 are described in more detail in the '590 application, the disclosure of which is hereby incorporated by reference herein.

Figure 5A:
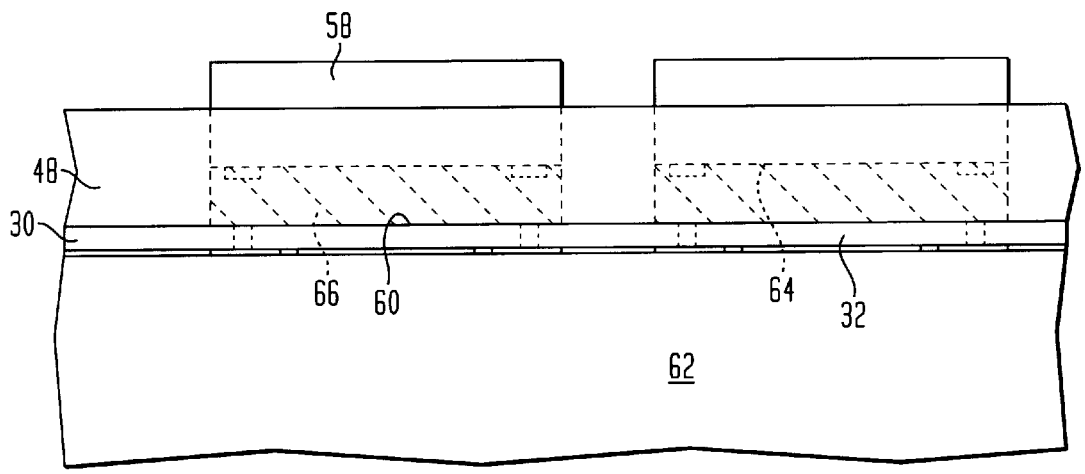
FIG. 5A shows a fragmentary side view of the flexible dielectric sheet shown in FIG. 4 after microelectronic elements have been assembled to the flexible dielectric sheet.

Referring to FIG. 5A, after the flexible dielectric sheet 30 has been secured to the carrier frame 48, semiconductor chips 58 may be assembled to the attachment region 60 of each connection component 32. The semiconductor chips 58 are preferably assembled with the respective connection components 32 by abutting a front contact bearing face 64 of each chip 58 against a compliant element 66 provided atop the attachment region 60 of each connection component 32. During chip assembly, a supporting plate 62 may be provided under the flexible dielectric sheet 30 so that the flexible sheet does not bow or flex when the chips 58 are assembled thereto.

Figure 5B:
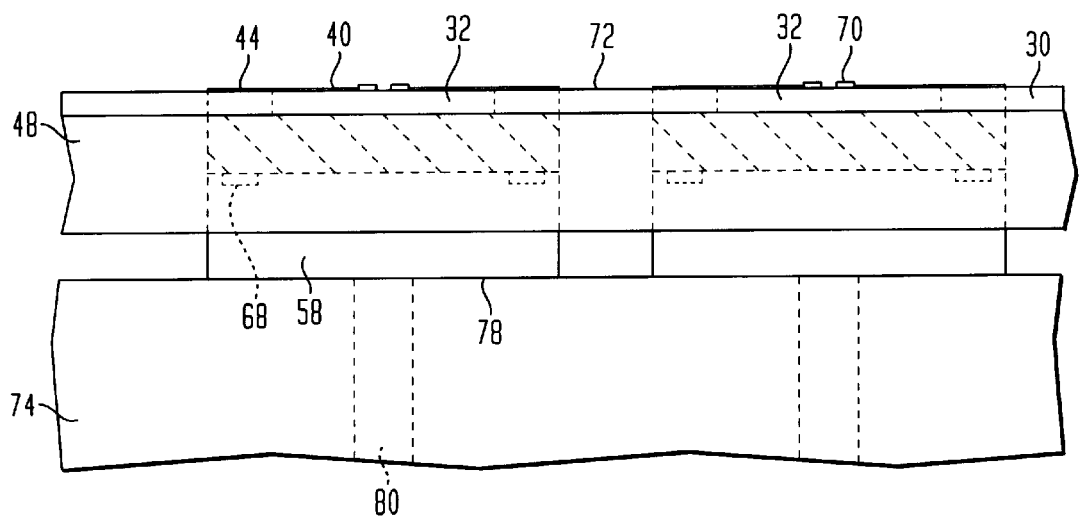
FIG. 5B shows the assembly of FIG. 5A after the carrier frame has been inverted and the microelectronic elements have been placed over the top surface of a work holder.

After the semiconductor chips 58 have been assembled to the connection components 32, the carrier frame 48 is inverted so that the flexible leads 40 are accessible for bonding the second ends 44 of the leads 40 to contacts 68 on the chip 58, as shown in FIG. 5B. A curable liquid encapsulant (not shown) may then be introduced between the chips 58 and the connection components 32 as described in commonly assigned U.S. Pat. No. 5,659,952, the disclosure of which is hereby incorporated by reference herein. The curable liquid encapsulant is then cured, such as by using heat or ultraviolet light, to provide a compliant interface for each chip package. After the encapsulant is cured, conductive elements, such as solder balls (not shown), are then preferably attached to the conductive terminals 70 accessible at the second surface 72 of the flexible dielectric sheet 30.

Referring to FIGS. 6A and 6B, in accordance with one preferred embodiment, a work holder 74 is provided for securing the carrier frame and chip packages during certain stages of the assembly process. The work holder 74 preferably has a top surface 76 including a central region 78 with a plurality or array of vacuum holes 80 formed therein. Each vacuum hole 80 desirably corresponds to the location of one of the connection components 32 (FIG. 1) when the flexible dielectric sheet 30 is positioned over the central region 78 of the work holder. The work holder 74 includes carrier frame alignment posts 82 for aligning the carrier frame 48 and the dielectric sheet 30 over the vacuum holes 80 and stencil alignment posts 84 for aligning various stencils and reservoirs over the work holder 74, as will be described in more detail below.

Figure 7A:
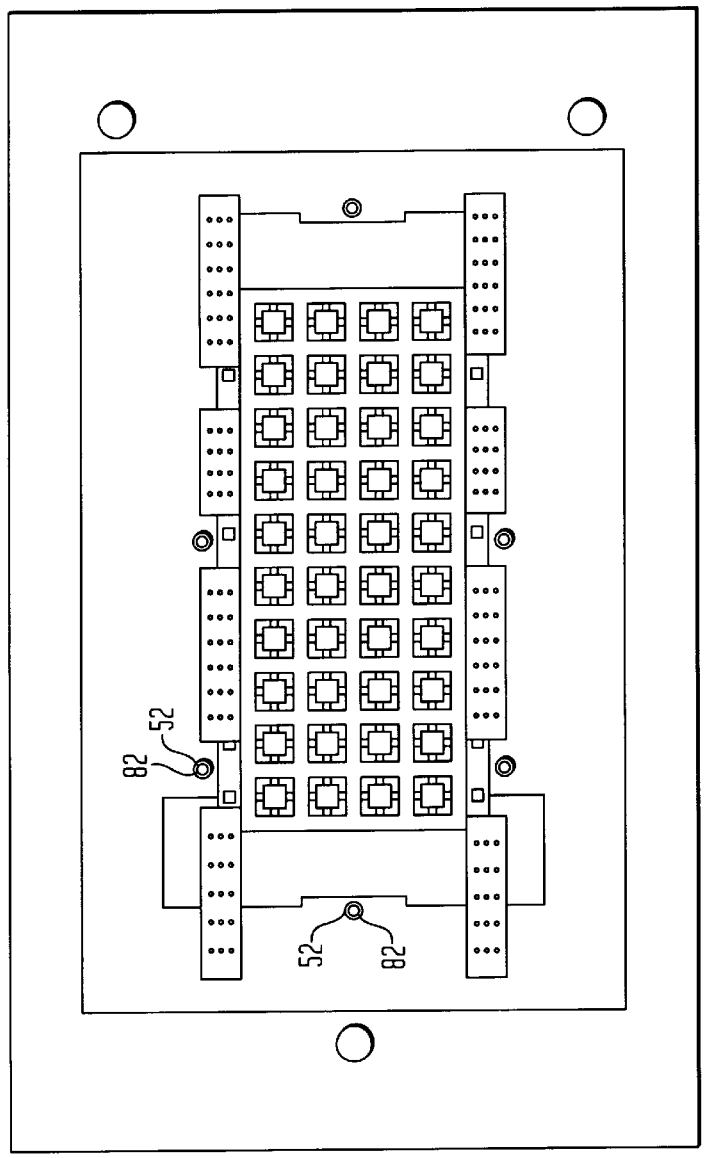
FIG. 7A shows the carrier frame and dielectric sheet of FIG. 4 positioned atop the work holder shown in FIG. 6B.
Figure 7B:
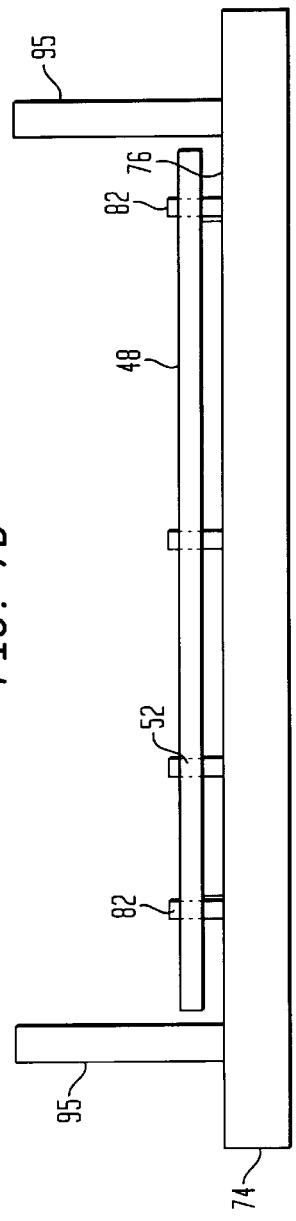
FIG. 7B shows a side view of FIG. 7A.

FIGS. 7A and 7B show the carrier frame 48, including the dielectric sheet 30 and the chips 58 assembled thereto (FIG. 5B), after the carrier frame 48 has been positioned atop the work holder 74. Referring to FIGS. 7A and 7B, the carrier frame 48 is preferably positioned atop the first surface 76 of the work holder 74 with the back surfaces 78 of the semiconductor chips 58 in contact with the top surface 76 of the work holder 74 and the second surface 72 of the flexible dielectric sheet 30 facing away from the top surface 76 of the work holder 74 so that the conductive terminals 70 are accessible for placing solder balls thereon. The carrier frame alignment posts 82 pass through the carrier frame alignment apertures 52 for properly aligning the flexible dielectric sheet 30 and then chips 58 assembled thereto over the vacuum holes in the work holder.

FIGS, 8 and 9 show one preferred method for providing masses of flux material atop the conductive terminals 70. FIG. 8 shows a single semiconductor chip package including a semiconductor chip 58 having a front face 64 and a flexible dielectric sheet 30 including a connection component 32 having one or more conductive terminals 70. A compliant interface 66 is provided between the flexible dielectric sheet 30 and the front face 64 of the semiconductor chip 58 and an encapsulant material 84 surrounds the chip package and extends between the chip 58 and the flexible dielectric sheet 30. Referring to FIG. 9, a flux stencil 86, having a plurality of apertures 88 therein is provided over a coverlay 87 overlying the second surface 72 of (lie flexible dielectric sheet 30 so that the apertures 88 in the flux stencil 86 are in substantial alignment with the conductive terminals 70. The flux stencil 86 is approximately 20–25 microns thick, and preferably includes alignment apertures (not shown) extending therethrough which receive the stencil alignment posts provided on the work holder 74. A vacuum is then applied through one or more vacuum holes 80 extending to the top surface 76 of the work holder 74 to hold the microelectronic assemblies in place, A visual inspection of the flux stencil 86 is then conducted to ensure that the flux stencil is properly aligned over the conductive terminals 70 on the flexible dielectric sheet 30. After proper alignment has been verified, a bead of flux material (not shown) is provided over a top Surface 89 of the stencil 86 and a sweeping device, such as a squeegee, is used to deposit the flux across the stencil. As the flux material is deposited across the top surface 89 of the flux stencil 86, a small mass of flux material 90 passes through each stencil opening 88 and sits atop one of the conductive terminals 70. Each deposited mass of flux material typically has a thickness of approximately 20–50 microns. Screening the flux material across the top surface 88 of the stencil 86 forms an array of flux pads 90 corresponding to the array of conductive terminals 70. Although FIGS. 8 and 9 show only one conductive terminal 70, the method steps described above may be used to provide a plurality of flux pads over a plurality of conductive terminals.

After the flux pads 90 have been stencil printed, the flux pads 90 are visually inspected to insure that the flux material has been properly disposed atop each conductive terminal 70, preferably by utilizing a microscope. Proper placement of the flux pads 90 may be also verified using an automated vision system. In preferred embodiments, the diameter of each flux pad 90 is larger than the diameter of the conductive terminal 70. For example, in one embodiment the flux pads 90 have a diameter of approximately 280–320 microns while the conductive terminals 70 have a diameter of approximately 250–275 microns.

After the flux pads have been deposited over the terminals, the terminals are ready to receive the conductive elements. In one preferred embodiment, the conductive elements are solder balls which are placed atop the flux pads using a stencil having a plurality of openings therein. The stencil preferably includes a main body portion having a top surface and a bottom surface with a plurality of openings extending therebetween. The second part of the stencil desirably includes a spacer element which is provided under the bottom surface of the main body portion for holding the main body portion remote from the flux pads. Holding the main body portion away from the flux pads is critical because it prevents the openings in the main body from being contaminated by flux, an occurrence which could result in one or more of the solder balls sticking to the stencil.

Figure 10A:
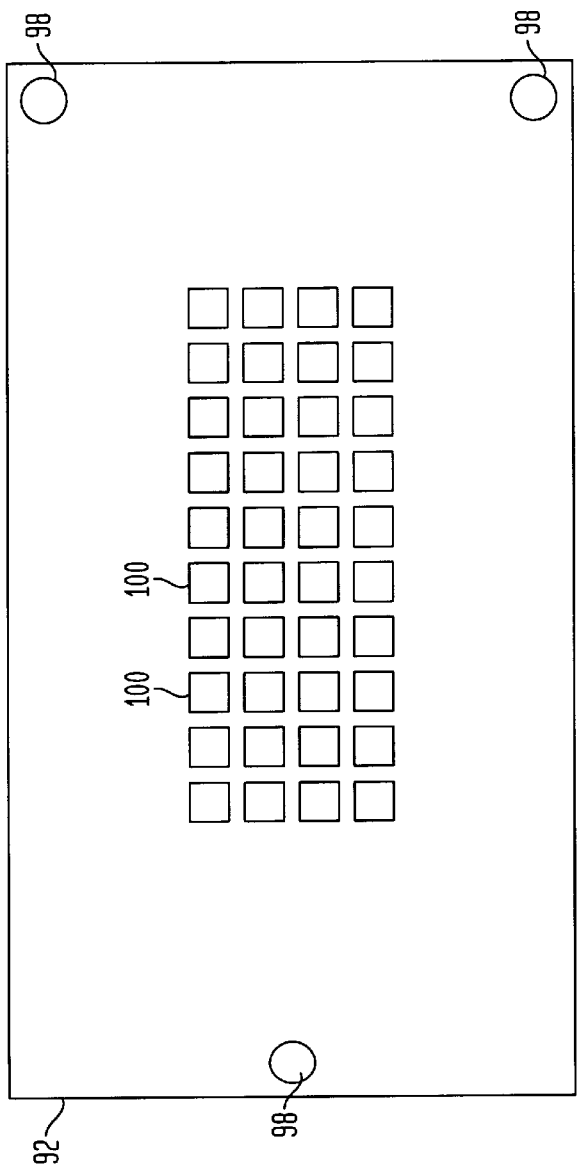
FIG. 10A shows a top view of a spacer element used for placing solder balls atop conductive terminals in accordance with one preferred embodiment of the present invention.
Figure 10B:
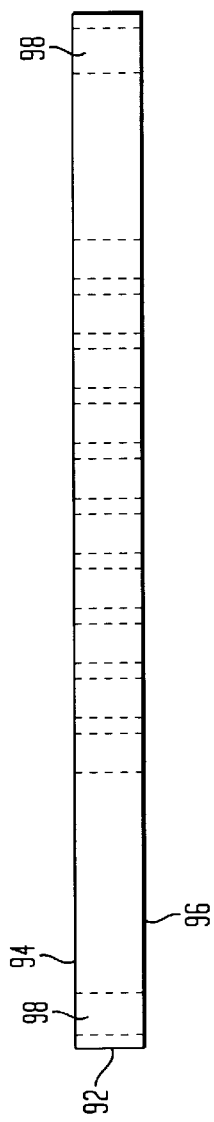
FIG. 10B shows a side view of the spacer element shown in FIG. 10A.

Referring to FIGS. 10A and 10B, in one preferred embodiment the spacer element 92 includes a substantially flat spacer plate having a top surface 94 and a bottom surface 96 and alignment apertures 98 for receiving the stencil alignment posts 95 of the work holder 74. The spacer plate 92 preferably has a thickness of approximately 80–100 microns and includes a plurality of relatively large openings 100 which generally correspond to the 3×10 array of connection components 32 on the flexible dielectric sheet 30. When the spacer plate 92 is provided over the flexible dielectric sheet 30, each opening 100 in the spacer plate 92 overlies one of the connection components 32 on the flexible dielectric sheet 30 so that all of the conductive terminals on the connection component fit within the opening 100.

FIGS. 11A and 11B show the spacer plate 92 positioned over the carrier frame 48 and the flexible dielectric sheet (not shown) by positioning the alignment apertures 98 in the spacer plate 92 with the stencil alignment posts 95 of the work holder 74 and then lowering the spacer plate 92 toward the first surface 76 of the work holder 74 so that the bottom surface 96 of the spacer plate 92 abuts against the carrier frame 48. As shown in FIG. 11A, each opening in the spacer plate is generally in substantial alignment with one of the connection components 32 on the flexible dielectric sheet. A visual inspection is then made to check for proper alignment of the spacer plate openings 100 over the connection components 32.

Figure 13:
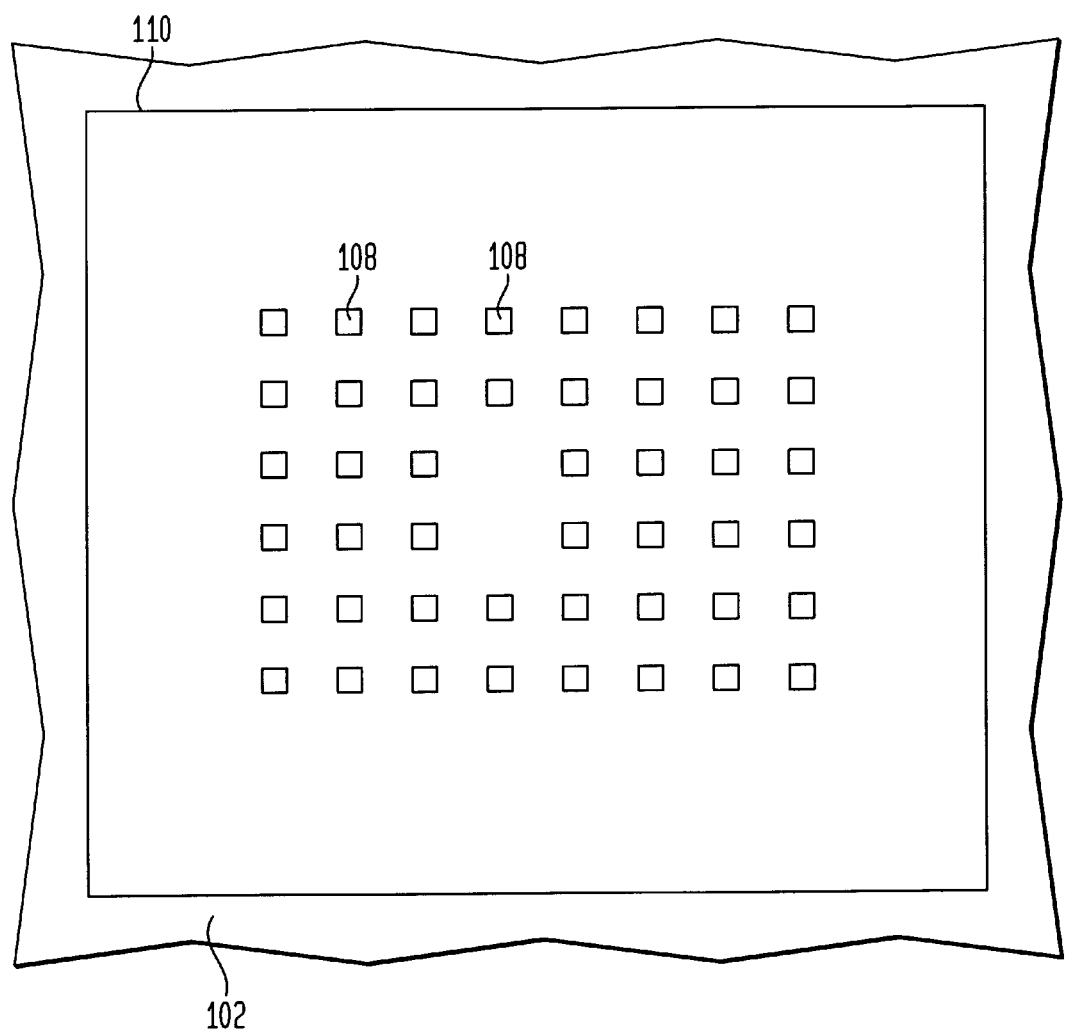
FIG. 13 shows a close up view of one solder ball placement region of the solder ball stencil shown in FIG. 12A.

Referring to FIGS. 12A and 12B, a solder ball stencil 102 is then provided for placing a solder ball atop each conductive terminal. The solder ball stencil 102 is preferably a substantially flat plate having a top surface 104, a bottom surface 106 and a plurality of relatively small openings 108 extending therethrough. The solder ball stencil 102 preferably has a thickness of approximately 160–200 microns and the array of openings 108 in each solder ball placement region 110 extend from the first surface to the second surface of the solder ball stencil 102. Each relatively small opening 108 is sized so that only one solder ball can pass through the opening at any one time. The openings 108 are preferably grouped together in an array of solder ball placement regions 110 which generally correspond to the array of openings 100 in the spacer plate 92. The solder ball stencil 102 shown in FIG. 12A includes thirty solder ball placement regions 110 which are configured in a 3×10 array. FIG. 13 shows an enlarged, close-up view of one of the solder ball placement regions 110 shown in FIG. 12A. Each solder ball placement region 110 includes an array or a plurality of solder ball sized openings 108 which substantially correspond with the conductive terminals of the microelectronic assembly associated therewith.

Figure 14A:
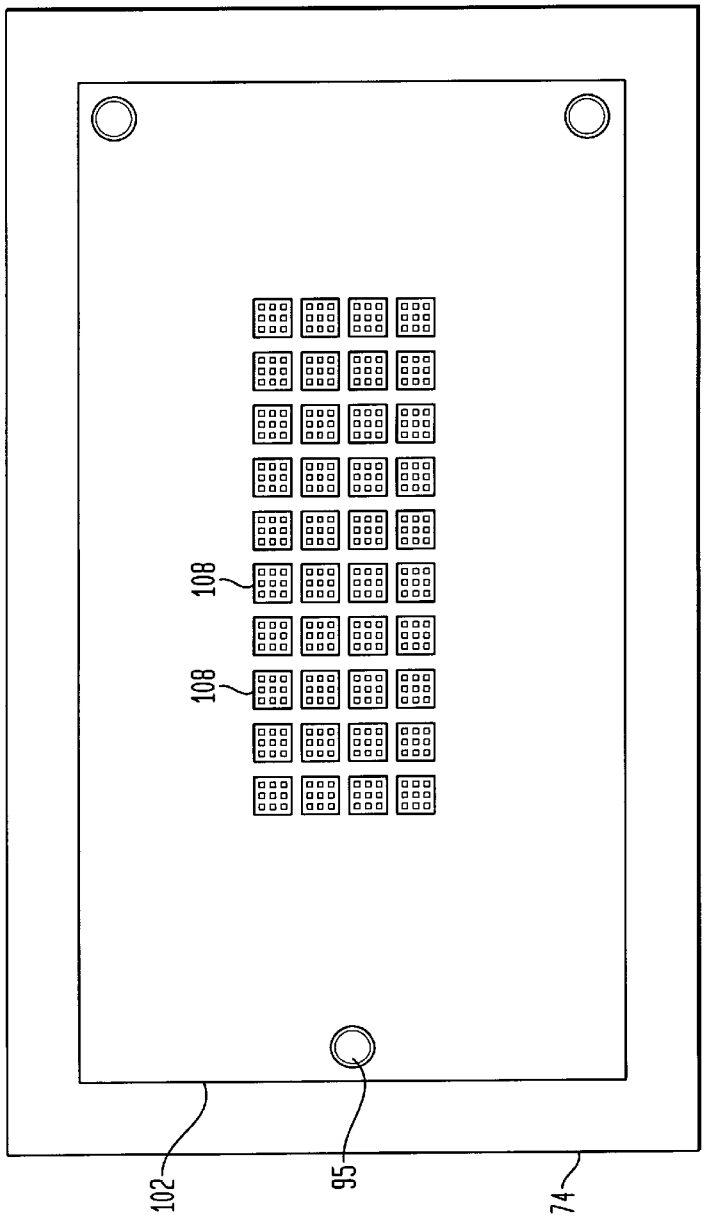
FIG. 14A shows the solder ball stencil of FIG. 12A positioned over the work holder.
Figure 14B:
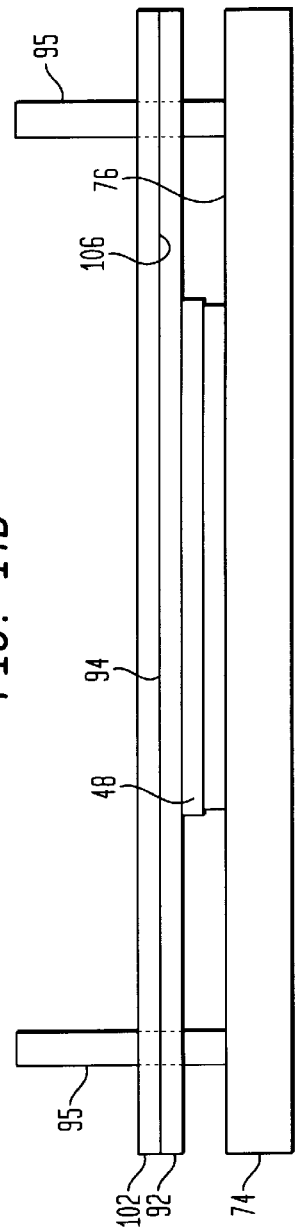
FIG. 14B shows a side view of FIG. 14A.

FIGS. 14A and 14B show respective top and side views of the work holder 74 after the solder ball stencil 102 has been placed atop the spacer plate 92. In order to properly position the solder ball stencil 102, the alignment apertures 105 therein are positioned over the stencil alignment posts 95 of the work holder 74. The solder ball stencil 102 is then moved in a downward direction toward the top surface 76 of the work holder 74 until the bottom surface 106 of the solder ball stencil 102 abuts against the top surface 94 of the spacer plate 92. As shown in FIG. 14B, the spacer plate 92 holds the solder ball stencil 102 remote from the carrier frame 48, thereby preventing the solder ball stencil 102 from becoming contaminated by the flux pads atop the conductive terminals. As mentioned above, if the solder ball stencil were to contact the flux pads, the flux material would contaminate the solder ball stencil 102, and particularly the openings 108 in the stencil 102, so that solder balls could not freely pass through the stencil openings.

Referring to FIGS. 15A and 15B, before the solder balls are deposited in the openings in the solder ball stencil, a reservoir 112 may be provided over the top surface 104 of the stencil 102. The reservoir 112 is preferably adapted to retain the solder balls atop the solder ball stencil 102 so that the location of the solder balls may be controlled. The reservoir 112 prevents the solder balls from rolling wildly or uncontrollably beyond the edges of the solder ball stencil 102. The reservoir 112 preferably has a central opening 114 therein which is defined by interior walls 116 which surround the solder ball placement regions 110 of the solder ball stencil 102. The reservoir 112 is substantially thicker than the solder ball stencil 102 so that the interior walls 116 have substantial height for effectively retaining the solder balls within the central opening 114 in the reservoir 112. The reservoir 112 also includes alignment apertures 118 extending therethrough for receiving the stencil alignment posts 95 of the work holder 74 so as to properly align the reservoir 112 over the solder ball stencil 102.

Referring to FIG. 16, after the reservoir 112 has been placed atop the solder ball stencil 102, the reservoir 112, the solder ball stencil 102 and the spacer plate 92 are preferably secured together, such as by using screws. Securing the reservoir 112, the solder ball stencil 102 and the spacer plate 92 together enables the secured elements to be simultaneously moved up and down the stencil alignment posts 95 of the work holder 74. As a result, the carrier frames 48 holding the microelectronic assemblies may be rapidly loaded and unloaded from the work holder 74, thereby generally improving overall production rates for placing solder balls on the conductive terminals.

Figure 17:
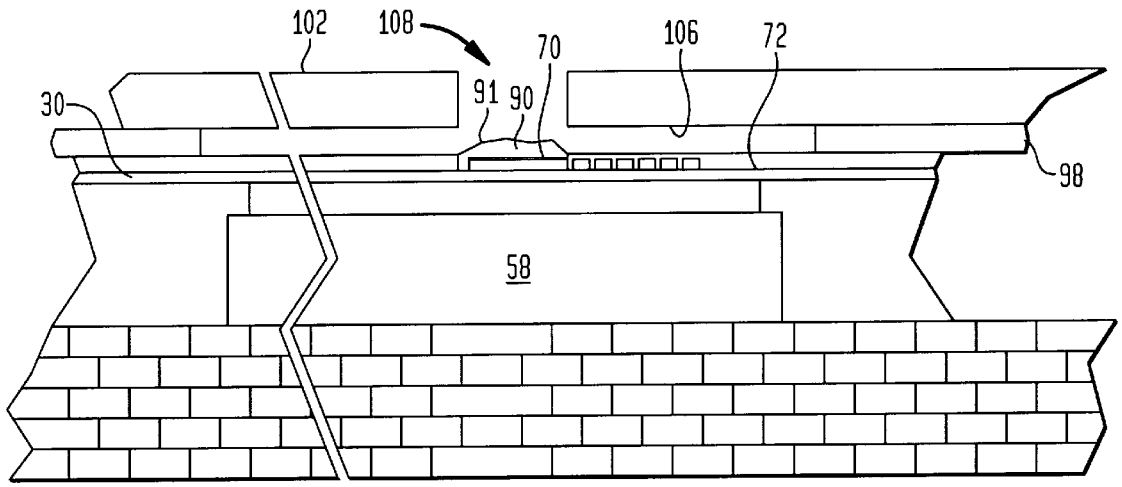

FIG. 17 shows the solder ball stencil 102 of FIGS. 14A and 14B after the stencil 102 has been property aligned over the masses of flux material 90. After the solder ball stencil 102 has been placed over the spacer plate 92, the stencil 102 is visually inspected to insure that the openings 108 in the solder ball stencil are in substantial alignment with the openings 100 in the spacer plate 92 and with the flux pads 90. The solder ball stencil 102 preferably has a thickness of approximately 160–200 microns and the spacer plate 92 has a thickness of approximately 80–100 microns. Thus, the spacer plate 92 holds the bottom surface 106 of the solder ball stencil 102 at least approximately 80–100 microns above the second surface 72 of the flexible dielectric sheet 30. As shown in FIG. 17, there is a significant gap between the top 91 of the flux pad 90 and the bottom surface 106 of the solder ball stencil 102. As a result, the stencil 102, and especially the openings in the solder ball stencil 102 cannot come in contact with the flux material 90, thereby avoiding contamination of the stencil 102. In other words, the bottom surface 106 of the solder ball stencil 102 is never closer than about 40–50 microns from the top 91 of the flux pads 90.

Figure 18:
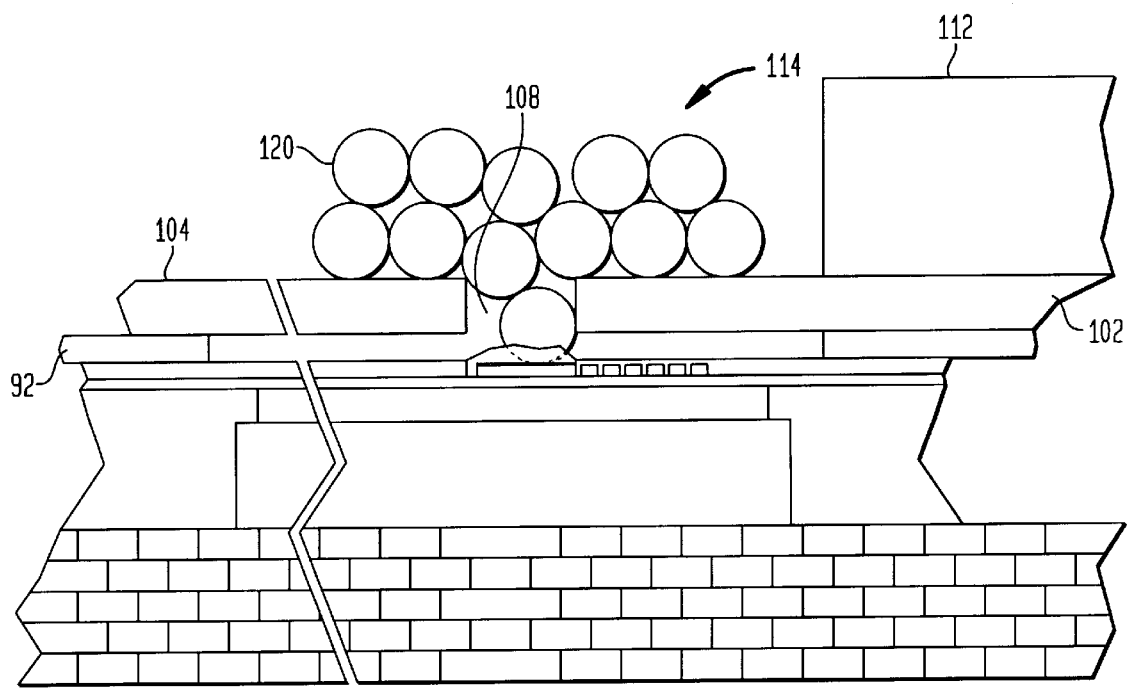

Referring to FIG. 18, after the solder ball stencil 102 and the reservoir 112 are positioned over the microelectronic assemblies, a plurality of solder balls 120 are provided within the central opening 114 in the reservoir 112 and over the top surface 104 of the stencil 102. A large number of solder balls 120 may collect around any one opening 108 in the solder ball stencil 102, however, because each opening 108 is not much larger than the diameter of the solder balls 120, no more than one solder ball may fit in any one opening 108.

Figure 19:
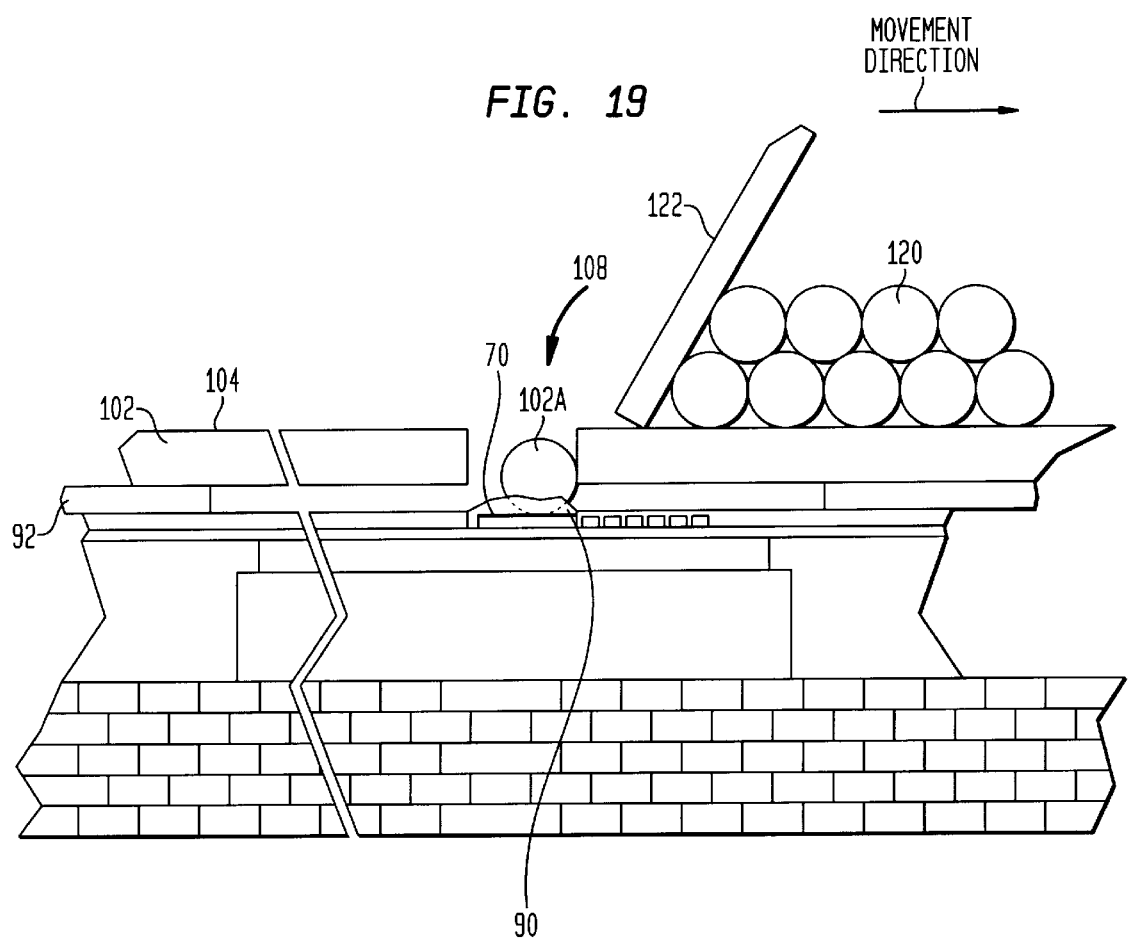

Referring to FIG. 19, a sweeper plate 122 may be used to sweep or move the solder balls 120 over the array of openings 108 in the solder ball stencil 102. The sweeper plate 122 may be approximately 100–130 microns thick and may include stainless steel. However, in other embodiments, a fine brush may be used to sweep the solder balls. Once one of the solder balls 120 falls through the opening 108 and is deposited atop the mass of flux material 90, the deposited solder ball (designated 120A) will be held in place by the flux 90 atop the conductive terminal 70. The combined thickness of the solder ball stencil 102 and the spacer plate 92 is approximately 240–260 microns which is generally equivalent to the 240–260 microns diameter of the solder balls 120. This particular design feature ensures that each deposited solder ball 120 will fall almost completely into one of the openings 108 in the solder ball stencil 102 and will not significantly protrude above the top surface 104 of the solder ball stencil 102. This avoids obstructing the movement of other solder balls 120 over the top surface 104 of the solder ball stencil 102. In addition, this particular feature prevents solder balls 120 which have been successfully deposited in one of the stencil openings 108 from becoming dislodged from the opening by other solder balls 120 moving across the top surface 104 of the stencil 102.

After the solder balls 120 have been swept across the top surface of the solder ball stencil 102, the top surface of the stencil is visually inspected to insure that a solder ball has been placed in each opening 108. The visual inspection may reveal that some of the solder balls 120 have not been centered exactly over the conductive terminals associated therewith, however, this is not a significant problem because when the solder balls are reflowed, as will be described in more detail below, each reflowed solder ball will only wet to the conductive terminal associated therewith and will tend to self-center over the conductive terminals. Any excess solder balls remaining over the first surface of the stencil may then be swept into a pocket provided in the reservoir. In one embodiment, the pocket (not shown) is cut into one of the interior walls 116 defining the central opening 114 of the reservoir 112 so that when the work holder 74 is tilted to one end, the solder balls 120 may be collected in the pocket.

Figure 20:
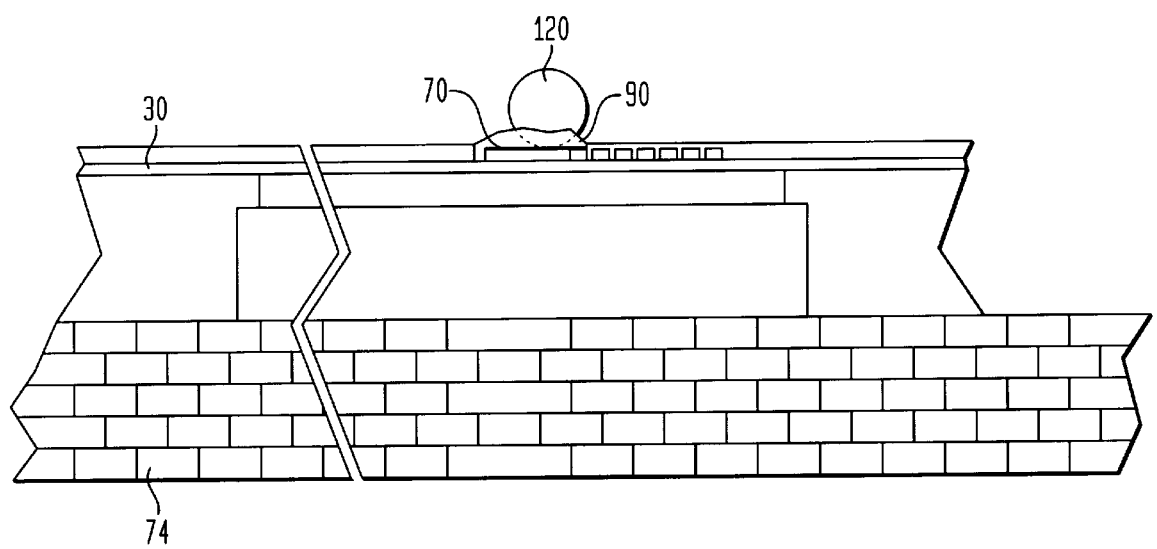

FIG. 20 shows a side view of a solder ball 120 which has been successfully placed atop a conductive terminal 70 and which is held in place by the flux material 90. After solder ball placement, the solder ball stencil 102 (not shown) is moved lip and away from the carrier frame 48 and the flexible dielectric sheet 30 so that the carrier frame 48 may be removed from the work holder 74. The flexible dielectric sheet 30 is then inspected to insure that the solder balls 120 have been properly placed over the terminals 70.

Figure 21:
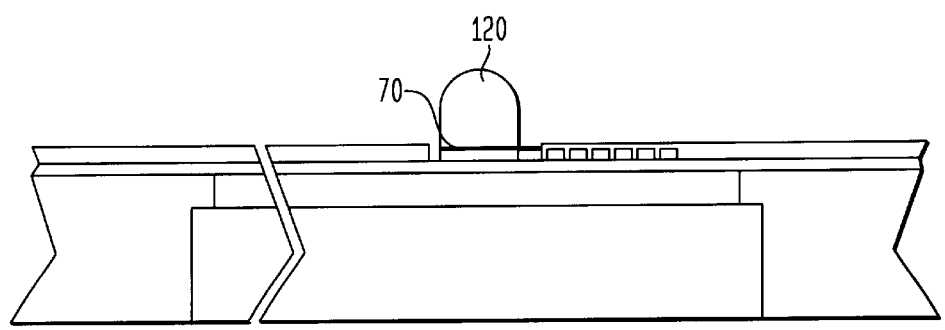

Referring to FIG. 21, the solder balls 120 are then reflowed so as to more permanently secure each solder ball 120 to the conductive terminal 70 associated therewith. A wide variety of methods may be used to reflow the solder balls, such as forced air convection furnace methods and/or hot plate convection methods. However, the particular methodology selected for reflowing the solder balls depends, in part, upon the composition and size of the solder balls. In certain embodiments, the microelectronic assemblies including the deposited solder balls are placed on a moving belt which passes the assemblies into a furnace. Once the belt moves the assemblies into the furnace, the solder balls are heated to a temperature above their melting point and maintained at or above the melting point for a predetermined period of time. The application of heat generally melts or reflows the solder balls 120 in place over the terminals 70, thereby enabling the reflowed solder balls to wet to the terminals. When the solder balls are in the molten or at least partially liquid condition, surface tension generally reshapes each solder ball into an at least partially spherically-shaped object. The solder balls are then cooled to a temperature below their melting point, at which point the solder balls re-solidify. The moving belt then carries the microelectronic assemblies out of the furnace. The assemblies are then visually inspected to ensure that a solder ball has been properly formed atop each conductive terminal. In one preferred embodiment, the conductive elements are maintained above their melting point temperature of 183° C. for approximately 35–40 seconds and the entire reflow procedure lasts approximately five minutes.

Figure 22:
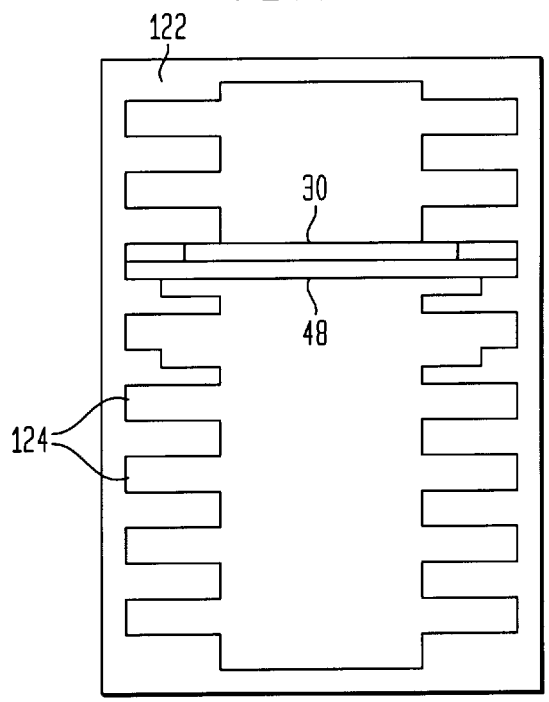
FIG. 22 shows a front view of a magazine for selectively storing the carrier frame shown in FIG. 4.

After the microelectronic assemblies have been removed from the furnace, the assemblies are defluxed, i.e. any excess flux remaining around the conductive terminals is removed. The defluxing process may be either a manual procedure or a fully automated procedure. In accordance with one preferred embodiment, the carrier frames 48 bearing the flexible dielectric sheets 30 are placed within a storage magazine 122 having a plurality of slots 124, as shown in FIG. 22. The magazine 122 is then immersed in a solution including liquid alcohol for approximately one minute so as to soften the excess flux around the conductive terminals. After approximately one infinite, the magazine 122 is removed from the solution and placed atop a drying rack so that any excess solution trapped within the magazine 122 may drain away. The individual carrier frames 48 are then removed from the magazine 122 and placed in a tub of liquid alcohol. The excess flux is then mechanically removed, such as by scrubbing around the conductive terminals with a scrub brush. In another embodiment, the excess flux may be removed using an automated procedure whereby a softening solution is used to completely dissolve the excess flux. In this latter embodiment, a mechanical action (i.e. scrubbing) is not required to remove the excess flux.

Figure 23:
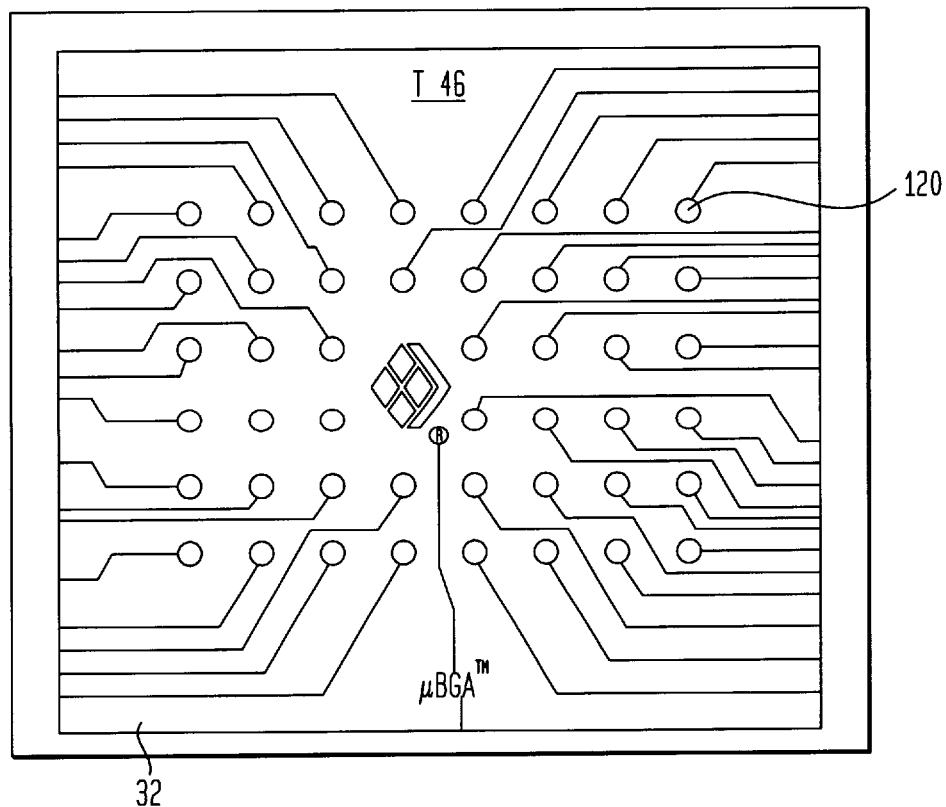
FIG. 23 shows a top view of a finished microelectronic assembly which has been assembled in accordance with preferred embodiments of the present invention.

FIG. 23 shows a top view of a finished microelectronic assembly after the solder balls 120 have been reflowed over the conductive terminals on the connection component 32, and after excess flux has been removed from the assembly. Once again, each assembly is visually inspected to insure that the solder balls 120 remain properly secured atop the conductive terminals. The individual assemblies may then be severed from the flexible dielectric sleet to provide individual chip packages or multi-chip modules including two or more semiconductor chips.

Referring to FIGS. 24A and 24B, further preferred embodiments provide a work holder 74' which is similar to that shown above in FIG. 7B, however, the work holder 74' includes a rotatable cam 126' positioned at one end thereof which enables the work holder to be selectively tilted. Selective tilting of the work holder 74' during certain stages of the assembly process described above may be desirable in order to move the solder balls over the top surface of the solder ball stencil or to collect any excess solder balls remaining oil the top surface of the stencil after the solder balls have been deposited over the terminals. In one preferred embodiments after the solder balls have been swept across the top surface of the solder hall stencil (not shown), the rotatable cam 126' is rotated in a counter-clockwise direction, as shown in FIG. 24B, so that the work holder 74' is tilted to one side. Once the work holder 74' has been tilted, any solder balls remaining atop the first surface of the solder ball stencil are swept into a pocket cut into one of the interior side walls of the reservoir shown in FIGS. 15A and 15B. As such, any excess solder balls remaining atop the solder ball stencil after the solder ball placement step may be collected and reused for making other microelectronic assemblies.

Figure 25A:
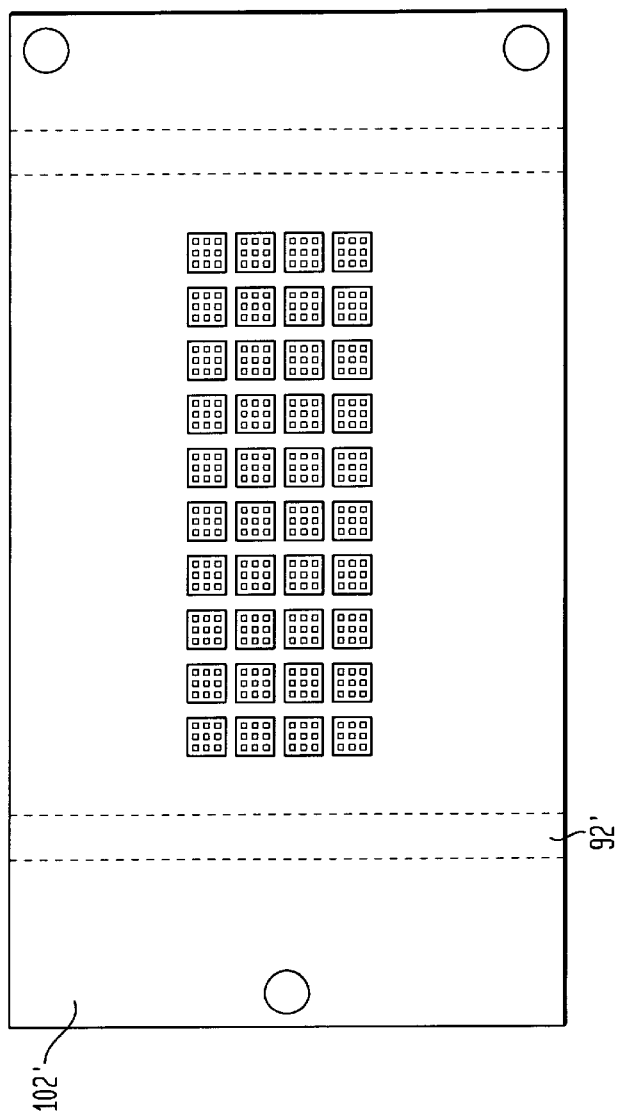
FIG. 25A shows a top view of a solder ball stencil including a spacer element attached to a bottom surface thereof in accordance with further preferred embodiments of the present invention.
Figure 25B:
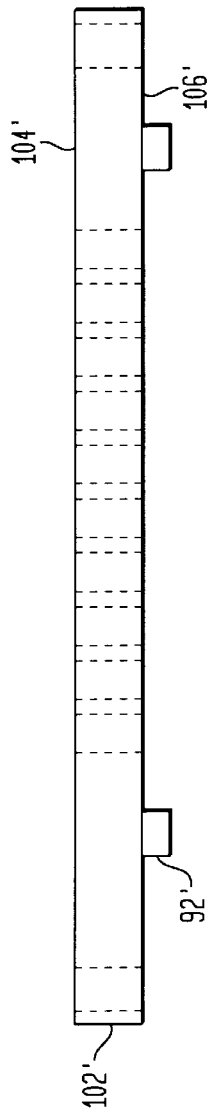
FIG. 25B shows a side view of FIG. 25A.

FIGS. 25A and 25B show respective top and side views of a stencil 102' for placing conductive elements, such as solder balls, in accordance with further preferred embodiments of the present invention. Stencil 102' includes top surface 104' and bottom surface 106' remote therefrom. The bottom surface 106' of stencil 102' has one or more support ribs 92' projecting therefrom. The support ribs 92' may be attached to the bottom surface 106' of stencil 102'. In other preferred embodiments, the support ribs 92' may be integrally connected to and project from the bottom surface 106' of the stencil 92'.

As will be appreciated, numerous variations and combinations of the features discussed above may be utilized without departing from the present invention as further defined by the claims. Accordingly, the foregoing description of the preferred embodiments should be taken by way of illustration rather than by way of limitation of the invention.

What is claimed is:

1. A method of placing conductive elements over terminals on a microelectronic assembly comprising the steps of:

providing a microelectronic element having a first surface and one or more terminals accessible at said first surface;

securing a spacer plate having a top surface, a bottom surface and at least one opening extending therethrough over the first surface of said microelectronic element so that said at least one opening is in substantial alignment with said terminals;

after the securing a spacer plate step, securing a stencil having a top surface and a bottom surface and a plurality of openings extending therethrough over said spacer plate so that the plurality of openings in said stencil are in substantial alignment with said terminals wherein said spacer plate maintains said stencil remote from said terminals; and depositing conductive elements through said openings in said stencil so that each said deposited conductive element is affixed atop one of said terminals.

2. The method as claimed in claim 1, further comprising the steps of depositing flux material atop said terminals before the depositing conductive elements step and maintaining said stencil remote from said flux material during said step of depositing conductive elements.

3. The method as claimed in claim 2, wherein the depositing flux material step includes selectively depositing a mass of flux material atop each said terminal and the securing a conductive element stencil step includes aligning the plurality of opening in said conductive element stencil over said masses of flux material.

4. The method as claimed in claim 3, wherein each said conductive element is affixed to one of said masses of flux material during the depositing conductive elements step.

5. The method as claimed in claim 1, wherein after the securing a conductive element stencil step, the top surface of said conductive element stencil and the first surface of said microelectronic element define a distance which is approximately equal to the diameter of said conductive elements so that said conductive elements do not substantially protrude over the top surface of said conductive element stencil.

6. The method as claimed in claim 5, wherein said spacer plate includes a substantially flat plate, and wherein after the securing a conductive element stencil step, said spacer plate is disposed between the first surface of said microelectronic element and the bottom surface of said conductive element stencil.

7. The method as claimed in claim 1, wherein said conductive element stencil includes a substantially flat plate.

8. The method as claimed in claim 7, wherein said conductive element stencil has a thickness of approximately 160–200 microns.

9. The method as claimed in claim 1, the method further comprising the step of heating said conductive elements so as to transform said conductive elements from a first solid condition to a second at least partially liquid condition.

10. The method as claimed in claim 9, wherein during the heating step said conductive element transform into more intimate contact with said conductive terminals.

11. The method as claimed in claim 9, wherein said conductive elements have a melting point, the heating step including the step of maintaining said conductive elements at or above the melting point for a predetermined time period.

12. The method as claimed in claim 11, further comprising the step of after the heating step, cooling said conductive elements below the melting point so as to transform said conductive elements back from the second at least partially liquid condition to the first solid condition.

13. The method as claimed in claim 3, wherein the step of selectively depositing a mass of flux material includes:

providing a flux stencil having a top surface and a bottom surface and a plurality of openings extending between the top and bottom surfaces;

abutting the bottom surface of said flux stencil against the first surface of said microelectronic element so that said flux stencil openings are in substantial alignment with said terminals; and screening flux material across the top surface of said flux stencil, whereby said flux material is forced into said openings to form a mass of flux material over each said terminal.

14. The method as claimed in claim 13, wherein said flux stencil has a thickness of approximately 20–25 microns.

15. The method as claimed in claim 13, wherein after the screening flux material step, each said mass of flux material has a thickness of approximately 20–50 microns.

16. The method as claimed in claim 12, further comprising the step of removing flux from said microelectronic assembly.

17. The method as claimed in claim 1, wherein the step of depositing conductive elements includes:

providing a plurality of said conductive elements over the top surface of said conductive element stencil; and moving said conductive elements over the top surface of said conductive element stencil so that one of the conductive elements is deposited in each said opening of said conductive element stencil.

18. The method as claimed in claim 17, further comprising the step of collecting any said conductive elements remaining over the top surface of said stencil after the moving step.

19. The method as claimed in claim 17, further comprising the step of placing a reservoir over the top surface of said stencil before the providing a plurality of said conductive elements step for retaining any said conductive elements remaining over the top surface of said stencil after the depositing a conductive element step.

20. The method as claimed in claim 19, wherein said reservoir includes a central aperture extending therethrough, said central aperture defining side walls adapted for retaining said conductive elements over the top surface of said stencil.

21. The method as claimed in claim 1, further comprising the step of selectively applying a vacuum force to said microelectronic element for securing said microelectronic assembly.

22. The method as claimed in claim 1, wherein said conductive elements include fusible masses having spherical shapes.

23. The method as claimed in claim 1, wherein said conductive elements include solder balls.

24. The method as claimed in claim 23, wherein said solder balls include materials selected from the group consisting of tin and lead.

25. The method as claimed in claim 24, wherein each said solder ball includes approximately 60–65% tin and 38–40% lead.

26. The method as claimed in claim 1, wherein said microelectronic element includes a semiconductor chip.

27. The method as claimed in claim 1, wherein said microelectronic element includes a printed circuit board.

28. The method as claimed in claim 1, wherein said microelectronic element includes a dielectric substrate.

29. The method as claimed in claim 1, wherein said conductive elements do not substantially protrude over the top surface of the stencil after the depositing conductive elements step.

30. The method as claimed in claim 1, further comprising the step of processing a plurality of microelectronic assemblies simultaneously.

31. A method placing conductive elements over terminals on a microelectronic assembly comprising the steps of:

providing a microelectronic element having a first surface and one or more terminals on the first surface;

selectively depositing a mass of flux material over each said terminal;

securing a spacer plate having a top surface, a bottom surface and at least one opening extending therethrough over the first surface of said microelectronic element so that said at least one opening is in substantial alignment with said terminals;

after the securing a spacer plate step, securing a stencil including a substantially flat plate having a top surface and a bottom surface and a plurality of openings extending between the top and bottom surfaces over said spacer plate so that the plurality of said openings in said stencil are in substantial alignment with said masses of flux material; and depositing a conductive element in each said opening in said stencil so that each said deposited conductive element is positioned atop one of said masses of flux material.

32. A method of placing conductive elements over terminals on a microelectronic assembly comprising the steps of:

providing a microelectronic element having a first surface and one or more terminals accessible at said first surface;

depositing flux material atop said terminal;

securing a spacer plate having a top surface, a bottom surface and at least one opening extending therethrough over the first surface of said microelectronic element so that said at least one opening is in substantial alignment with said terminals;

after the securing a spacer plate step, securing a stencil over said spacer plate so that the plurality of openings in said stencil are in substantial alignment with said terminals, said spacer plate maintaining said stencil remote from said flux material; and depositing conductive elements through said openings in said stencil and onto said terminals so that said deposited conductive elements are affixed to said flux material.

* * * * *

UNITED STATES PATENT AND TRADEMARK OFFICE
CERTIFICATE OF CORRECTION

PATENT NO. : 6,162,661

DATED : December 19, 2000

INVENTOR(S) : Link

It is certified that error appears in the above-identified patent and that said Letters Patent is hereby corrected as shown below:

Column 2, line 63, change "immaterial" to --material--.
Column 8, line 48, change "(lie" to --the--.
Column 8, line 62, change "Surface" to --surface--.
Column 12, line 10, change "lip" to --up--.
Column 13, line 20, change "oil" to --on--.
Column 13, line 22, change "embodiments" to --embodiment,--.
Column 13, line 23, change "hall" to --ball--.
Column 14, line 43, change "element" to --elements--.

Signed and Sealed this

Eighth Day of May, 2001

Attest:

NICHOLAS P. GODICI

Attesting Officer

Acting Director of the United States Patent and Trademark Office